(12) United States Patent  (10) Patent No.: US 7,823,786 B2
Oliva et al.  (45) Date of Patent: Nov. 2, 2010

(54) LASER SCANNER FOR READING OPTICAL CODES

(75) Inventors: Guido M. Oliva, Rovigo (IT); Kurt Vonmetz, Bologna (IT); Stefano Amorosi, Bologna (IT)

(73) Assignee: Datalogic S.p.A., Bologna (IT)

( * ) Notice: Subject to any disclaimer, the term of this patent is extended or adjusted under 35 U.S.C. 154(b) by 0 days.

(21) Appl. No.: 12/385,601

(22) Filed: Apr. 14, 2009

(65) Prior Publication Data

US 2009/0206160 A1 Aug. 20, 2009

Related U.S. Application Data

(60) Division of application No. 11/518,493, filed on Sep. 11, 2006, now Pat. No. 7,533,822, which is a continuation of application No. 10/899,023, filed on Jul. 27, 2004, now Pat. No. 7,131,590, which is a continuation of application No. 09/983,552, filed on Oct. 24, 2001, now abandoned.

(60) Provisional application No. 60/281,014, filed on Apr. 4, 2001.

(30) Foreign Application Priority Data

Oct. 26, 2000 (EP) .................................. 00830707
Dec. 28, 2000 (EP) .................................. 00830860

(51) Int. Cl.
*G02B 5/08* (2006.01)
(52) U.S. Cl. .............................. 235/462.36; 235/462.42; 235/454
(58) Field of Classification Search ............ 235/462.36, 235/462.42, 462.43, 454
See application file for complete search history.

(56) References Cited

U.S. PATENT DOCUMENTS

| 4,309,605 | A | 1/1982 | Okabe |
| 4,760,248 | A | 7/1988 | Swartz et al. |
| 4,808,804 | A | 2/1989 | Krichever et al. |
| 4,832,469 | A | 5/1989 | Noguchi et al. |
| 5,010,242 | A | 4/1991 | Frontino |
| 5,170,277 | A | 12/1992 | Bard et al. |
| 5,187,353 | A | 2/1993 | Metlitsky |
| 5,200,597 | A | 4/1993 | Eastman et al. |
| 5,233,170 | A | 8/1993 | Metlitsky et al. |
| 5,258,605 | A | 11/1993 | Metlitsky et al. |
| 5,274,491 | A | 12/1993 | Collins et al. |
| 5,283,802 | A | 2/1994 | Hsiung |
| 5,386,105 | A | 1/1995 | Quinn et al. |
| 5,440,111 | A | 9/1995 | Eastman et al. |
| 5,545,886 | A | 8/1996 | Metlitsky et al. |

(Continued)

FOREIGN PATENT DOCUMENTS

DE  296 16 565 U1  3/1997

(Continued)

OTHER PUBLICATIONS

EP Office Action mailed Mar. 31, 2009 in related EP application 05016198.3.

(Continued)

*Primary Examiner*—Ahshik Kim
(74) *Attorney, Agent, or Firm*—Nixon & Vanderhye, P.C.

(57) ABSTRACT

There is described a compact laser module (1) for reading optical codes, comprising: a scanning illumination section having at least one source (8) for generating a laser beam, and a scanner (9, 10) for scanning the optical code (C) to be read with a laser spot, and a receiving section (20-24) for collecting at least a portion of the light diffused by the code (C) and detecting the collected light, the receiving section and the scanning illumination section being spatially distinct.

18 Claims, 12 Drawing Sheets

U.S. PATENT DOCUMENTS

| | | |
|---|---|---|
| 5,552,592 A | 9/1996 | Dvorkis et al. |
| 5,663,549 A | 9/1997 | Katz et al. |
| 5,682,029 A | 10/1997 | Dvorkis et al. |
| 5,712,470 A | 1/1998 | Katz et al. |
| 5,745,176 A | 4/1998 | Lebens |
| 5,763,866 A | 6/1998 | Seo et al. |
| 5,796,087 A | 8/1998 | Hazama |
| 5,805,362 A | 9/1998 | Hayes |
| 5,805,382 A | 9/1998 | Hays |
| 5,811,778 A | 9/1998 | Itou et al. |
| 5,864,128 A | 1/1999 | Plesko |
| 5,912,450 A | 6/1999 | Katz et al. |
| 5,955,720 A | 9/1999 | He et al. |
| 5,956,438 A | 9/1999 | Eloy |
| 5,969,323 A | 10/1999 | Gurevich et al. |
| 6,024,283 A | 2/2000 | Campanelli et al. |
| 6,039,254 A | 3/2000 | Frosse-Peeck et al. |
| 6,056,199 A | 5/2000 | Wiklof et al. |
| 6,181,491 B1 | 1/2001 | Sano et al. |
| 6,360,949 B1 | 3/2002 | Shepard et al. |
| 7,062,259 B1 | 6/2006 | Oliva |
| 7,063,259 B2 | 6/2006 | Oliva |
| 7,131,590 B2 * | 11/2006 | Oliva et al. ............ 235/462.36 |

FOREIGN PATENT DOCUMENTS

| | | |
|---|---|---|
| EP | 0 367 299 A2 | 5/1990 |
| EP | 0 524 029 | 1/1993 |
| EP | 0 566 341 | 10/1993 |
| EP | 0 572 685 | 12/1993 |
| EP | 0 582 958 | 2/1994 |
| EP | 0 582 958 A2 | 2/1994 |
| EP | 0 584 830 | 3/1994 |
| EP | 0 652 530 | 5/1995 |
| EP | 0 672 936 A2 | 9/1995 |
| EP | 0 731 417 | 9/1996 |
| EP | 0 762 574 A1 | 3/1997 |
| EP | 1 096 415 | 5/2001 |
| EP | 1 233 296 A2 | 8/2002 |
| JP | 57-4188 A | 1/1982 |
| JP | 59-75372 A | 4/1984 |
| JP | 62-232185 A | 10/1987 |
| JP | 62-239434 A | 10/1987 |
| JP | 63-6890 A | 1/1988 |
| JP | 63-51687 A | 3/1988 |
| JP | 2-250023 A | 10/1990 |
| JP | 4-220786 A | 8/1992 |
| JP | 5-130334 A | 5/1993 |
| JP | 5-205087 A | 8/1993 |
| JP | 5-217013 A | 8/1993 |
| JP | 6-38576 A | 2/1994 |
| JP | 6-53618 A | 2/1994 |
| JP | 6-61566 A | 3/1994 |
| JP | 6-61575 A | 3/1994 |
| JP | 6-208642 A | 7/1994 |
| JP | 6-314350 A | 11/1994 |
| JP | 6-318265 A | 11/1994 |
| JP | 7-134747 A | 5/1995 |
| JP | 7-261203 A | 10/1995 |
| JP | 8-511639 A | 12/1996 |
| JP | 9-34976 A | 2/1997 |
| JP | 9-121068 A | 5/1997 |
| JP | 10-105636 | 4/1998 |
| JP | 10-105636 | 4/1998 |
| JP | 11-39422 A | 2/1999 |
| JP | 11-338958 A | 12/1999 |
| JP | 2001-500987 A | 1/2000 |
| JP | 2000-113493 A | 4/2000 |
| JP | 2000-298242 A | 10/2000 |
| WO | 94/29815 A1 | 12/1994 |
| WO | 98/12660 | 3/1998 |

OTHER PUBLICATIONS

European Search Report mailed Jul. 24, 2009 in corresponding EP application 09007131.7.
Japanese Preliminary Notice of Rejection and English translation thereof mailed May 15, 2007 in corresponding Japanese application 2001-329519.
Patent Abstracts of Japan vol. 6, No. 64 (E-103), Apr. 1982 & JP 57 004188 (Ricoh Co Ltd), Jan. 1982.
Patent Abstracts of Japan vol. 8, No. 183 (P296), Aug. 1984 & JP 59 075372 (Casio Keisanki KK), Apr. 1984.
European Search Report completed Nov. 8, 2005 in corresponding EP application No. 05016198.
Patent Abstracts of Japan, vol. 1995, No. 7, Aug. 1995, (JP 07-093453).
English translation of the Japanese Preliminary Notice of Rejection mailed May 16, 2006 in corresponding JP appln. No. 2001-329520.
H. Schenk et al, "A Novel Electrostatically Driven Torsional Actuator" Proc. $3^{rd}$ Int. Conf. on Micro Opto Electro Mechanical Systems, Aug. 30-Sep. 1, 1999.
B. Schmidt et al, "UETP—MEMS Ca Project—Course Micro Actuators" 1997.
Datasheet of Opticon VLM-Serie Lasermodule, 1998.

* cited by examiner

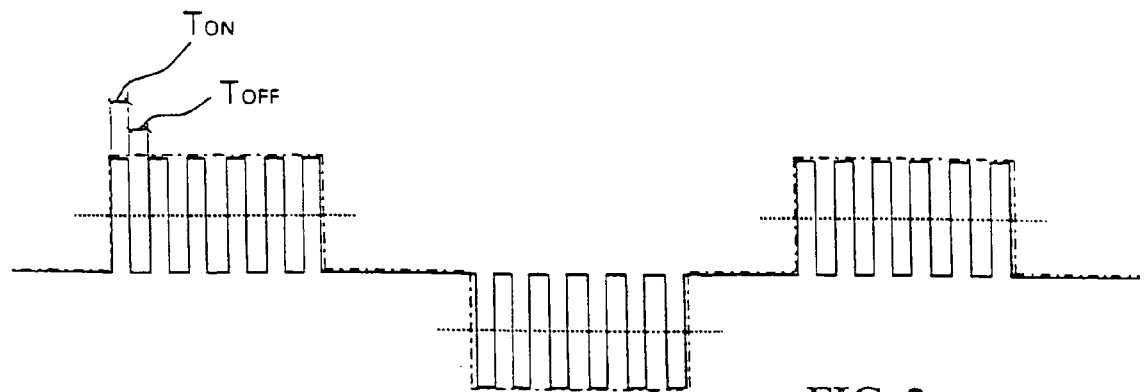
FIG. 2
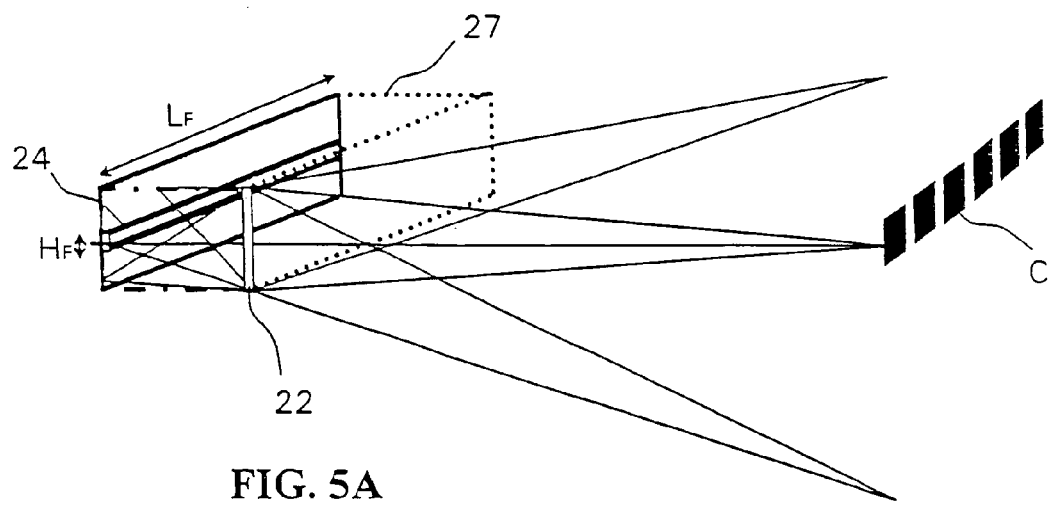
FIG. 5A
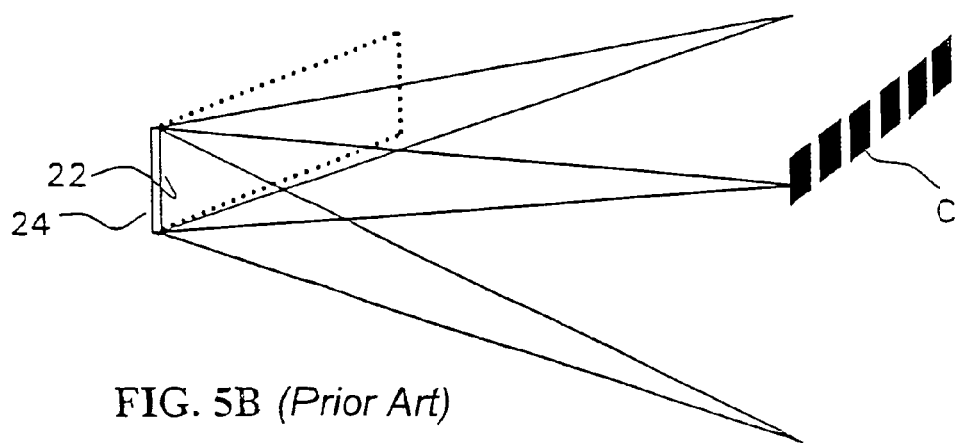
FIG. 5B *(Prior Art)*

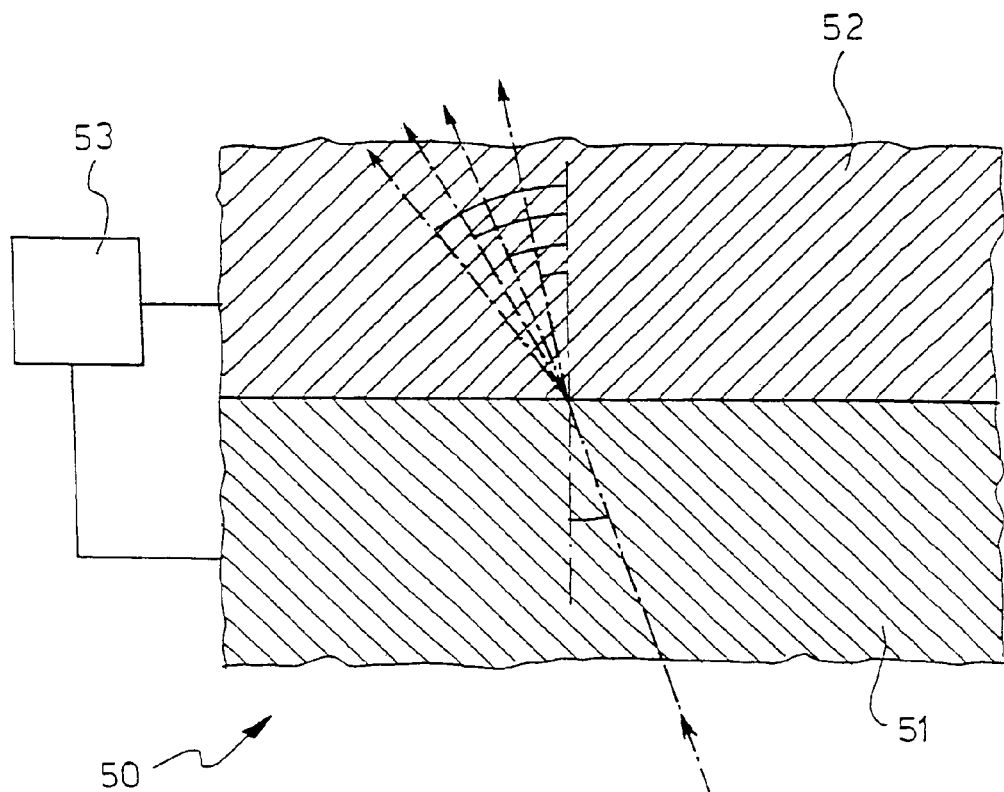
FIG. 10
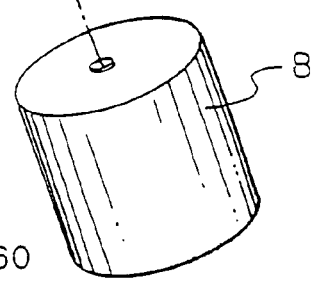
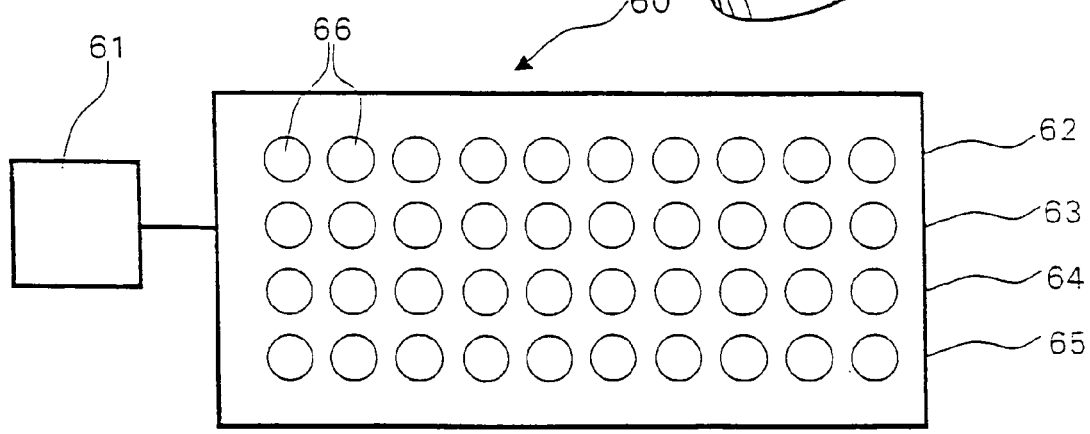
FIG. 11

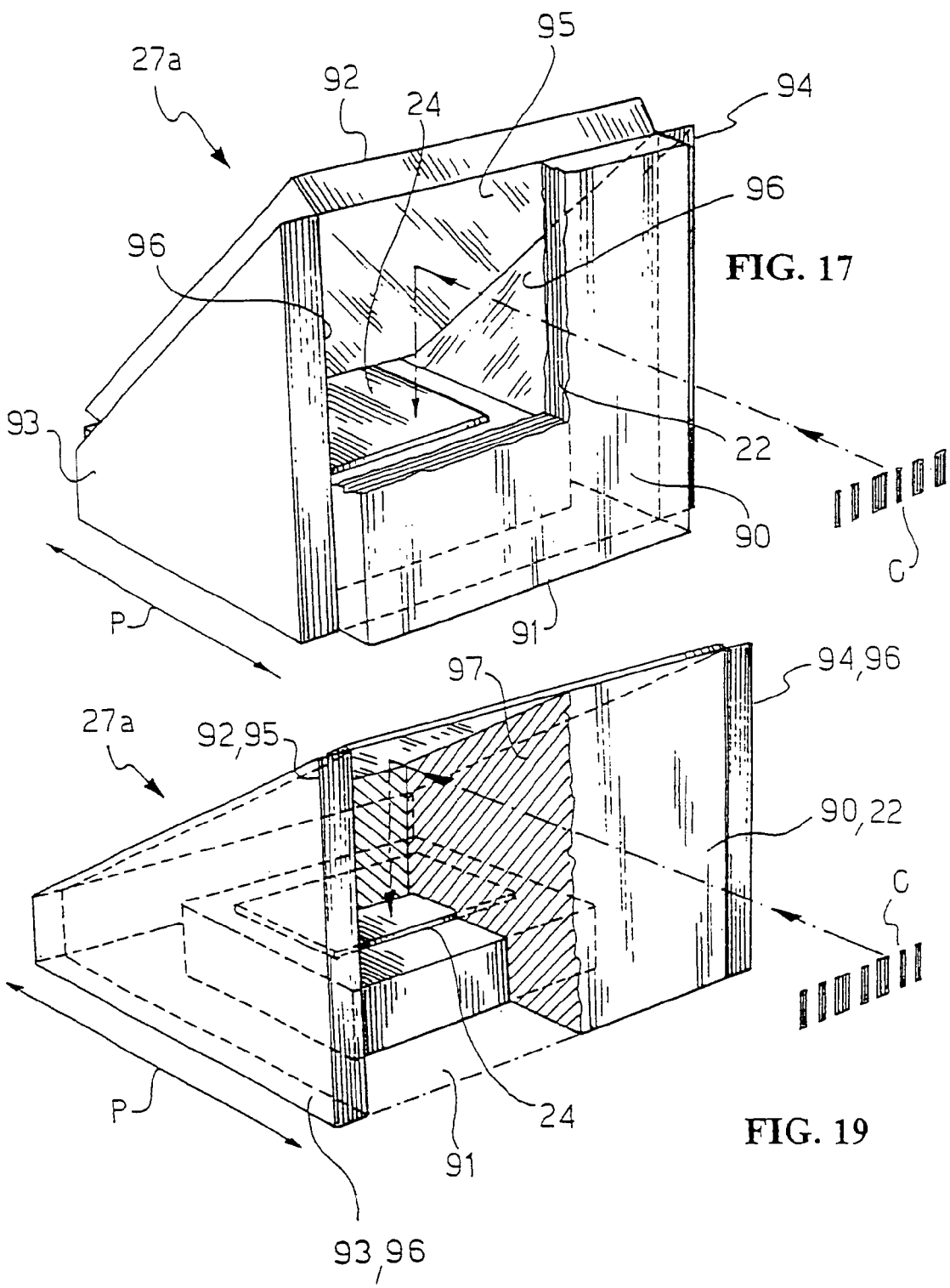

LASER SCANNER FOR READING OPTICAL CODES

This application is a divisional application of U.S. patent application Ser. No. 11/518,493 filed Sep. 11, 2006 (now U.S. Pat. No. 7,533,822), which is a continuation of U.S. patent application Ser. No. 10/899,023 filed Jul. 27, 2004 (now U.S. Pat. No. 7,131,590), which is a continuation of U.S. patent application Ser. No. 09/983,552 filed Oct. 24, 2001 (abandoned), which claims the benefit of U.S. provisional patent application Ser. No. 60/281,014 filed Apr. 4, 2001 and U.S. patent application Ser. No. 09/773,384 filed Feb. 1, 2001 (now U.S. Pat. No. 7,063,259), all of which is incorporated herein by reference.

BACKGROUND OF THE INVENTION

1. Field of the Invention

The present invention relates to apparatus for reading optical codes.

2. Discussion of Prior Art

Known optical code readers can essentially be divided into readers wherein the entire code width is simultaneously illuminated, as through an array of LEDs, and the diffused light is simultaneously collected and detected, as by an array of linear or matrix sensors ("imaging" of the optical code), and readers wherein a laser beam sweeps a certain angle so that a laser spot scans the optical code ("flying spot"), and the diffused light is collected and detected by photo-detecting elements of the photodiode and/or CCD and/or C-MOS type.

The readers of the second type include a laser module for reading optical codes having essentially a source for generating a laser beam of predetermined size and shape, means for generating a scan of the laser beam on the optical code to be read, means for collecting at least a portion of the light diffused by the code, and photo-detecting means for detecting the collected light and converting the detected luminous power into an electrical signal reproducing as accurately as possible the reflectance modulations of the elements forming the code.

Known laser modules are of the retro-reflective type, that is, they are such that the field of view framed by the light collecting optics coincides, instant by instant, with that framed by the scan means. In other words, the apertures used for scanning the laser beam along the code to be read are the same used for collecting the diffused light towards the detection optics.

A technical problem addressed by the technology described herein is size reduction for an optical code reader.

BRIEF SUMMARY

The expression "compact laser module", in the present description is used to indicate a laser module whose volume is not greater than about 20 cm$^3$, preferably not greater than 1.5 cm$^3$.

A retro-reflective configuration of whatever kind implies that the aperture of the scan system coincides with that of the receiving system. Thus, the reduction of the size of a reading system of this kind collides with the fact that, reducing the size of the scan system, that of the optics for collecting the light diffused by the code is reduced as well, thus reducing the amount of light actually collected, with strong effects on the noise of the optical signal and on the maximum possible reading distance.

The above problem is solved, by providing for the components for collecting and detecting the light diffused by the code to be totally separate from the illuminating and scanning components, so that the light for illuminating the code and the light diffused by the code follow totally separate paths. By so unrelating the components of the illumination system (light emission window, any laser beam deflection mirror, focusing lenses, etc.) to the size requirements of the collecting and detecting elements (light receiving aperture, focusing lens, surface of photo-detecting elements, etcetera), imposed by the minimum amount of diffused light that must be collected for reading the optical code, it is obtained that the size of the scanning illumination section, and more in general, that of the laser module, can be significantly reduced.

The invention thus relates to apparatus for reading optical codes comprising:

a scanning illumination section having at least one source for generating a laser beam, and means for scanning the optical code to be read with a laser spot, and a receiving section for collecting at least a portion of the light diffused by the code and detecting the collected light, the receiving section and the scanning illumination section being spatially distinct.

Through a suitable relative arrangement of the components of the scanning illumination and receiving sections, as well as through the use of particular components, the size of the laser module can be further reduced quite below the typical size of known laser modules. Moreover, thanks to the small size, any moving components provided for scanning the laser beam exhibit less inertia upon start up, and low consumption.

In first embodiments of the scanning illumination section, the scan means comprises motor means and an optically reflecting member moved by the motor means for receiving and deflecting the laser beam.

Thanks to the fact that the optically reflecting means must not serve as the surface for collecting the light diffused by the code, its size can be considerably reduced with respect to the mirror scan systems of the prior art.

More in particular, the optically reflecting mirror is of a size, in the direction perpendicular to the scan plane that is less than 1.5 mm.

Advantageously, the motor means provides a continuously variable angular speed.

This allows carrying out such a control of the motor as to produce a speed pattern changing from scan to scan, or, partly, also within each scan, so as to adjust the reading speed to the application peculiarities and to the processing electronics capacities.

Even more preferably, upon start up, said motor means is driven with a ramp signal.

This provision, which allows reaching the operating speed gradually and optimising the same operating speed as a function of the particular optical code to be read, is particularly useful in case of blurred or very small codes.

Typically, said motor means comprises a motor selected between a brushless motor and a stepping motor.

Preferably, moreover, said motor is of a height lower than 9 mm, more preferably lower than 6 mm, even more preferably lower than 3 mm.

Although motors of such a size are suitable thanks to the small size and weight of the optically reflecting member, they allow keeping the laser module size in the direction perpendicular to the scan plane extremely limited.

As an alternative, said motor means comprises a rotating magnetic disk motor and the optically reflecting member is directly supported on the motor magnetic disk.

Besides allowing obtaining a small thickness (in the above range), this solution allows assembling the electronic control components directly on the motor casing, optionally with a shielding against electromagnetic noise caused by powering the same motor, thus improving the efficiency of the amplification circuits of the received signal.

In another alternative, said motor means comprises an electrostatic motor.

Preferably, moreover, the motor means is driven with pulse width modulation.

In this way, the motor consumption is advantageously reduced.

Typically, the optically reflecting member comprises at least a portion of the side faces of a polygonal-base body, and it is rotationally moved by the motor means.

A scan system of this type, sometimes called polygonal mirror scan system" hereinafter, allows reaching even very wide scan angles without significant speed variation—besides possible controlled variations, as said above—in the entire scan line. Moreover, thanks to its small size, the polygonal mirror is not affected by the inertia disadvantages usually associated to scan systems of this type.

Advantageously, the side faces of the polygonal-base body are sloping at respective different angles with respect to its axis.

This provision is useful for reading "stacked" bar codes, that is, with more bar sequences stacked on one another.

As an alternative, the optically reflecting member comprises a single surface, and is moved with an alternately oscillating motion along a circumference arc.

Such an optically reflecting member, typically a plane mirror, to which reference shall sometimes be made hereinafter for shortness, can be advantageous since the mirror weight is further reduced with respect to the rotating polygonal mirror scan system.

The oscillating motion is obtained through a suitable driving of the above-cited various types of motor means.

In an alternative that is advantageous because of extremely low consumption, said motor means comprises an oscillating magnetic device.

More in particular, the oscillating magnetic device comprises, on a common insulating substrate:
  a magnetic core having a conductor winding around it, and an air gap, and
  an elongated magnetic element having an end that is free to oscillate towards and away from the air gap of the magnetic core, and carrying the optically reflecting member.

This construction allows obtaining extremely reduced thicknesses, of a few tenths of millimetre, that is to say, only limited by the size of the laser spot incident on the optically reflecting member.

In further alternative embodiments of the scanning illumination section, the scan means comprises a device selected between an electro-optical device and an acousto-optical device.

Scan devices of this type are very fast and without moving parts, so that they are less subject to mechanical failure, and are not affected by wear.

In a last alternative embodiment of the scanning illumination section, which exhibits similar advantages, it comprises an array of laser micro-sources, and the scan means comprises a controller for sequentially actuating the laser micro-sources of a row of the array.

Preferably, moreover, the array of laser micro-sources comprises more rows.

The plurality of scan lines which may thus be generated is particularly advantageous for reading stacked codes.

Advantageously, moreover, each row of laser micro-sources of the array is of a respective colour.

Having a plurality of scan lines with different colours available, the optical code reading is more versatile as regards the chromatic contrast between code and background of the same code.

In the above various embodiments of the scanning illumination section, the scan means or the laser micro-sources are preferably arranged as far as possible from a front face of the laser module.

In the present description and attached claims, the expression "front face" is used to indicate the laser module face intended to face the optical code to be read. Such an expression must in no way be construed as being referred to an absolute orientation of the laser module in the optical code reader in which it is intended to be included, let alone to an absolute spatial orientation. Similarly, expressions such as "rear face", "lower face", "upper face" and "side face" must not be construed in an absolute meaning, but with respect to the above front face.

With this provision, the scan width is already maximised at the laser module output, so that it is possible to read optical codes that are close to the laser module, thus maximising the light collection.

Moreover, advantageously, the scan means exhibits a predetermined stand-by position, in which it projects the laser beam in at least one fixed laser spot at the code.

The predetermined stand-by position, in the case of rotary motors (with rotating or oscillating optically reflecting member), is set by providing a direct voltage to a single stator winding, or by the absence of charge on the capacitors, the optically reflecting member being so mounted that, in this position, the laser beam strikes the centre of the or a face, or strikes a corner in the case of a polygonal-base body; in the case of the magnetic oscillating device, it is set by the absence of power supply in the winding; in the case of electro-optical or acousto-optical devices, it is set by the absence of driving of the same devices; in the case of the array of micro-sources, it is set by turning on the central source, or the two end sources of a row. In this way, upon the module start up, one or two laser spots are produced at the centre of the scan field or at its two ends, useful to aim the module towards the optical code to be read.

In this case, the scan means can be actuated for scanning after a preset delay from the actuation in the predetermined stand-by position or from turning on the laser, or through the second position of a dual-position switch, or there can be provided two independent actuating buttons.

Moreover, for safety reasons, it can be provided for the laser source to be turned off if after a preset time interval from its turning on with the scan means in the stand-by position, the scan means is not actuated for scanning.

Advantageously, the scan laser light is high frequency modulated.

This allows separating, in the output signal of the receiving section, the information contained in the modulated signal, which is the part of interest, from that contained in the non-modulated signal, which is the noise due to the ambient light.

In particular, the scan laser light can be modulated so as to obtain a signal suitable to measure the optical code distance, for example as described in EP 0 652 530 A2.

Typically, moreover, the receiving section comprises at least one focusing lens in the proximity of the front face of the laser module, and at least one photo-detecting element at the focus of the focusing lens.

In particular, there can be provided a single focusing lens and a single photo-detecting element having suitable shape and area, a single focusing lens and a plurality of photo-detecting elements, or a plurality of focusing lenses and a corresponding plurality of photo-detecting elements, so that the field of view of each photo-detecting element only includes a portion of the optical code scan line. The field of view of each photo-detecting element will have, in this case, a geometrical shape depending on the shape of the photo-detecting element itself (square, rectangular or circular) and on the particular lens used.

Typically, there is also a slit between said at least one focusing lens and said at least one photo-detecting element.

Such a slit allows precisely selecting the overall photo-detection area interested by the light collecting and/or further reducing the field of view of the or each photo-detecting element.

When there is a plurality of photo-detecting elements, there is preferably provided also means for synchronising the actuation of the photo-detecting elements of said plurality with said scan means.

In this way, the signal/noise ratio is improved, and the laser module consumptions are reduced.

In some embodiments of the receiving section, it is essentially parallelepiped, said at least one photo-detecting element being arranged in close proximity of the rear face of the laser module.

In this way, one or more lenses are used, having a long focal length, essentially equal to the depth of the module. Since a lens with a long focal length perfectly focuses only when the code is at the maximum distance, while as the code is moved closer the formed image is increasingly out of focus, an increasingly greater fraction of the luminous energy diffused by the optical code is not detected, thus compensating the effect that a closer code receives and diffuses more light than a farther code. Less sensitivity to the optical code distance is thus obtained. Moreover, thanks to their retrocessed position, the photo-detecting elements do not collect rays that are sloping with respect to the scan plane, which represent ambient light not coming from the code, that is to say, noise.

Moreover, there can be provided photo-detecting elements arranged in close proximity of side faces of the receiving section.

In this way, it is possible to effectively recover all the light coming from the scan line edges, thus increasing the collection efficiency of the receiving section without increasing the noise due to ambient light.

In a further preferred way, all the photo-detecting elements are arranged along an optimum focus curve of a single focusing lens.

In alternative embodiments, the receiving section comprises a chamber having a front face, a lower or respectively upper face orthogonal to it, a sloping face between them, and side faces shaped as right-angled triangles, said at least one focusing lens being arranged at the front face, said at least one photo-detecting element being arranged at the lower or respectively upper face, and there being provided an internally reflecting surface at the sloping face.

This wedge-like shape of the receiving section is advantageous for various reasons. In fact, the light rays diffused by the code travel a first "horizontal" path from the focusing lens to the internally reflecting surface, and a second "vertical" path from the internally reflecting surface to the photo-detecting elements. It is thus possible to use—depth size being equal—a lens having a longer focal length with respect to a parallelepiped receiving chamber, with the above advantages, or—focal length being equal—it is possible to construct a receiving chamber having a smaller depth, with advantages in terms of compactness of the laser module. Moreover, the "horizontal" arrangement of the photo-detecting elements allows using a single commonly marketed photodiode, having a large area, without adversely affecting the laser module thickness. Moreover, the "horizontal" arrangement of the photo-detecting elements prevents the need of providing a "vertical" printed circuit, on the contrary it is possible to use a single printed circuit also for powering and controlling the scanning illumination section.

Preferably, the slope angle between the sloping face and the front face is less than 45 degrees.

Even more advantageously, internally reflecting surfaces are also provided at the side faces of the receiving chamber.

In this way, it is possible to effectively recover all the light coming from the scan line edges, thus increasing the collection efficiency of the receiving section without increasing the noise due to ambient light.

For further improving the light collection efficiency, the side faces can be slightly converging away from the front face.

In an embodiment, the receiving chamber is solid, made of an optically transparent material.

This allows making the entire chamber as a single block, thus better controlling the mutual orientation of the various faces.

Preferably, moreover, in any embodiment of the receiving section, said at least one focusing lens is selected between a cylindrical lens and a toric lens.

Such lenses exhibit the maximum light collection efficiency, providing a field of view that is wide along the scan line, and narrow in the direction orthogonal thereto, that is to say, they exhibit a high rejection of ambient light.

In a particularly preferred way, said at least one focusing lens is a Fresnel cylindrical lens.

This solution is advantageous since its flat shape makes assembling thereof particularly easy, practically in contact with a receiving window, thus also increasing the collection efficiency, since a lens shielding by the same receiving window is not created. Moreover, such a lens can operate up to a unitary focal length-to-diameter ratio, in which condition a traditional lens is affected by considerable reflections on the surface.

Moreover, advantageously, said at least one focusing lens is made of a coloured plastic material with high-pass filter behaviour.

The colour shall be properly selected based on the scanning laser light colour and on the chromatic contrast between the optical code and its background. In this way, the lens concurrently acts as a filter for absorbing visible wavelengths that are lower than that of the scan laser light.

In this case, advantageously, the receiving section comprises a common glass filter having a low-pass treatment.

In this way, the overall cost of lens and filter is significantly reduced with respect to the traditional implementation of colourless lens and red protective glass.

As an alternative, the focusing lens is coloured with low-pass filter behaviour on its optically non-active face.

In an embodiment, for minimising the transversal dimensions of the laser module, the scanning illumination section and the receiving section are arranged in stacked planes.

In this case, for maximising—laser module thickness being equal—the front face area usable for collecting the light diffused by the code, preferably the scanning illumination section comprises an emission window having a height substantially equal to the laser beam diameter in that plane.

In practice, the emission window height is minimum, only just as to allow the exit of the scanning laser light without interfering with it.

In an alternative embodiment, for minimising the laser module thickness, the scanning illumination section and the receiving section are arranged in a common plane.

In this case, in order to limit also the size in the scan line direction, the photo-detecting elements of the receiving section can partially extend in front of motor means of the scanning illumination section.

For the same purpose, the scan means or the array of laser micro-sources can be arranged in close proximity of the front face of the laser module.

Moreover, in a particularly advantageous way, in both embodiments the laser module comprises a support block for commonly supporting the components of the receiving section, and the components of the scanning illumination section.

This solution facilitates the assembling operations which, also due to the small sizes involved, may be critical.

For the same purpose, the support block and the components of the scanning illumination and receiving sections can have conjugate means for assembling the components in predetermined positions, such as for example notches or slits on the casing of a scan motor, on a laser source, on a scan mirror, etcetera, and assembling tabs or clips present on the support block, or slits for inserting lenses, filters and other optical components, or a block for a snap-fit housing the motor, and suitable to be constrained to the support block in more points.

Even more preferably, the support block exhibits at least one wall extending transversally to the front face for defining an insulated chamber for the scan laser light propagation.

In this way, the photo-detecting elements of the receiving section are usefully shielded from the light directly emitted by the scanning illumination section.

Preferably, moreover, the support block exhibits at least one insulated light extraction path at an end portion of the scan, and a photo-detecting element arranged at the end of each extraction path.

In this way, the photo-detecting element originates a scan start and/or end signal or pulse which can be used by the decoding components of the optical code reader in which the laser module is inserted for synchronising on the single scan, for example for beginning to search an optical code within the scan line. Moreover, this signal can be particularly useful for decoding systems based on the reconstruction of partial decodings, obtained from respective scan lines. Finally, such a signal can be used for safety reasons, turning off any laser source if it is not received within a preset time after the laser module or the scan means are turned on.

BRIEF DESCRIPTION OF THE DRAWINGS

Features and advantages of the invention shall now be illustrated with reference to embodiments, shown by way of a non-limiting example, in the attached drawings, wherein:

FIG. 2 shows the preferred signal for powering the laser source of the laser module;

FIGS. 5A and 5B respectively show the arrangement of photo-detecting elements in the laser module and in a laser module according to the prior art;

FIG. 10 schematically shows another embodiment of a scanning illumination section for the laser module;

FIG. 11 schematically shows still another embodiment of a scanning illumination section for the laser module;

FIG. 16 schematically shows a further embodiment of the laser module; and

FIGS. 17 to 19 schematically show alternative embodiments of a receiving section of the laser module.

DETAILED DISCUSSION OF PREFERRED EMBODIMENTS

Figure 1:
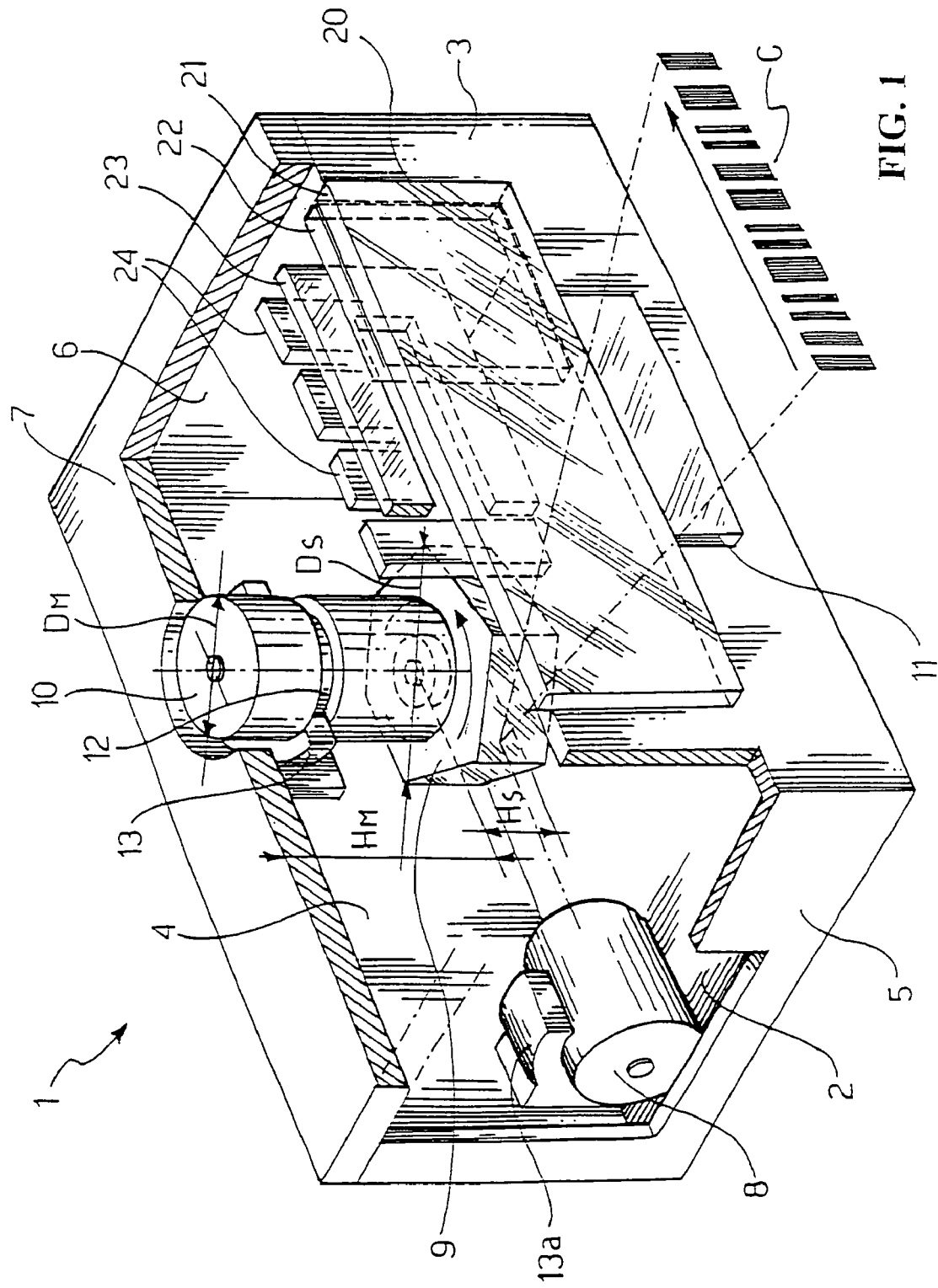
FIG. 1 schematically shows a perspective, partly broken-away view of a first embodiment of a laser module for reading optical codes.

As shown in FIG. 1, a laser module 1 exhibits a parallel-epiped shape, having a base face or wall 2, a front wall 3, a rear wall 4 erected from the major sides of base 2, side walls 5, 6 and a top wall 7. The size of such a module 1 is comparable to that of a small match box, in any case such as to take up a volume less than 20 cm$^3$.

Firstly, the laser module 1 houses components of a scanning illumination section, consisting of a laser source 8 or emitter, an optically reflecting member 9, made in FIG. 1 as a hexagonal right-angled prism having at least a portion of the faces of the side surface that is mirror-like, and a motor 10.

The optically reflecting member or polygonal mirror 9 is rotatively moved by motor 10. The laser beam emitted by emitter 8 is reflected by the reflecting faces of the polygonal mirror 9 according to angles depending on the instant position of the mirror 9 itself, so that the laser beam sweeps a certain angle in a scan plane parallel to the base wall 2 of module 1, exiting from its front wall 3 through an emission window 11. Thus, the laser beam scans the optical code C with a laser spot.

More in particular, the laser emitter 8 is arranged adjacent to the rear wall 4 of module 1 and in the proximity of the polygonal mirror 9, on which it directly emits the laser beam, avoiding any intermediate mirror. This allows minimising the overall dimensions, and simplifying the operations for optically aligning the system, which on a mirror 9 of such a small size as required (and as specified hereinafter) would be very critical.

Preferably, the laser emitter 8 is fastened to the wall through a clip 13a whose shape is complementary to the shape of its outside casing, so that the position of the laser emitter 8 is fixed with respect to the laser module 1.

For improving the rejection to ambient light, the beam generated by the laser emitter 8 can be modulated at a high frequency, for example at about 40 MHz. In this way, it is possible to separate the information contained in the modulated signal, which is the part of interest, from that contained in the non-modulated signal, which is the noise due to ambient light.

Of particular applicative interest, moreover, the laser light can be high frequency modulated so as to allow the optical code reader in which the laser module 1 is included to act as a measurer of the optical code distance from the reader itself, for example as described in European patent application EP 0 652 530 A2.

Motor 10, for example a direct current, brushless or stepping motor, has a cylindrical body whose base has a diameter $D_M$ that is less than or equal to 5 mm and whose height $H_M$ can be as small as less than 3 mm. The optically reflecting member 9 is mounted on it, preferably directly rotatively coupled to it, and in the embodiment as a polygonal mirror it is of a diameter $D_S$ less than 7 mm, a height $H_S$ of the optically active surface less than 1.5 mm and a mass less than 0.3 g. Such a small size of the polygonal mirror 9 allows obtaining a very small rotating mass and thus, a low inertia, so as to allow mirror 9 to reach the desired revolving speed in a very short time, less than 100 msec.

More in particular, motor 10 and mirror 9 are arranged with the respective axes orthogonal to the base 2 of module 1, and as close as possible to the rear wall 4, so as to originate a scan as far as possible from the emission window 11. Such an arrangement allows the scan line width to be already maximum at the emission window 1, and it thus allows covering the entire width of the optical code C to be read already at a few centimetre distance (about 4 cm) beyond the emission window 11.

Similarly to the laser emitter 8, it is important that the position of motor 10 and optically reflecting member 9 in the laser module 1 is fixed. Motor 10 can thus advantageously be provided with a slit 12 or notch on the cylindrical body, intended for being coupled to a clip 13 protruding from the rear wall 4 of the laser module 1, so that the height of motor 10 is fixed with respect to the laser module 1, thus ensuring the height of the polygonal mirror 9 with respect to the base 2 of laser module 1. Of course, notch 12 and clip 13 are to be construed as merely examplificative of conjugate fastening means.

Motor 10 exhibits a revolving speed that can be continuously varied from a minimum of 750 revolutions/minute to a maximum of 8,000 revolutions/minute, so as to obtain, for example in the case of a polygonal mirror 9 with hexagonal base, scan speeds comprised between 75 and 800 scan/sec. Of course, by varying the number of side faces of the polygonal mirror 9 it is possible to obtain a variation interval shifted upwards or downwards: thus, with a pentagonal-base body, there will be from 62 to 660 scan/sec, whereas with an octagonal-base body, there will be from 100 to 1050 scan/sec.

In order to improve the reading of high-resolution optical codes, or of codes that are far from the laser module 1, advantageously the speed of motor 10—and therefore, that of the optically reflecting member 9—can be varied in real time. In fact, the effect of a bar code having very narrow bars, as well as that of a code located far away, consists in a bar focusing loss due to the upper limit of the electronics passband. It follows that, even though the laser spot is focused, the signal is attenuated by the limits of the electronics. Traditionally, polygonal-mirror systems have slow response times to the revolving speed variation, but the use of a polygonal mirror 9 having such a small mass allows making its response to the imposed speed variations very fast. In this way, if the code is not read at the first scan, it is possible to reduce the revolving speed, thus "enlarging" the bars, reducing at the same time the operating frequency of the electronics, which thus attenuates less. With a lower attenuation by the electronics, the signal is definitely more focused. Moreover, the adjustment capability can be exploited upon start up, by driving the motor with a ramp signal to reach the operating speed more gradually. In this way, in the case of a particularly difficult code, due to the high resolution, or to the presence of deformations in the bars, it is possible to carry out the first scans at a reduced speed, thus facilitating the decoding.

By using a scan start signal, provided for example in the manner described below, it is possible more in general to perform such a control of the motor as to produce a speed pattern changing from scan to scan, or partly, also within each scan, so as to adjust the reading speed to the application peculiarities and to the processing electronics capabilities.

In order to reduce the consumption of motor 10 it is advantageous to use on the driving signal a pulse width modulation (PWM) method, which consists (refer to FIG. 2) in driving the different phases (typically three) of the motor, rather than with a continuous wave (represented with dots and lines in FIG. 2), with a pulse train having a duty cycle, that is, a ratio start up time $t_{on}$ to period $t_{on}+t_{off}$, typically of 50%. In this way, as it can be seen, the current absorbed by motor 10—power supply voltage being equal—, and the consumption of the laser module 1 accordingly, is reduced by a factor equal to the duty cycle. With this provision, as yet not used for driving laser modules although per se known in large-size motors, the consumption of the laser module 1 is lower than 70 mA when at operating power. Due to the very low inertia of the polygonal mirror 9, the torque reduction of motor 10 resulting from the use of this powering method, does not affect the performances described so far.

The use of the polygonal mirror 9 as the optically reflecting member allows obtaining a scan on a very wide angle. For example, an octagonal-base body with outer diameter $D_S$ of 7 mm struck by a laser beam of 0.6 mm in diameter, allows a useful scan of 62°, a hexagonal-base body with the same outer diameter $D_S$ and with the same incident beam allows a useful scan of 91°, and so on. Theoretically, in fact, an N-faced polygon allows covering an optical angle of 360*2/N degrees. In practice, this angle is smaller since the laser spot, at the end of each face of the polygonal mirror, is truncated and "split" between two adjacent faces, thus producing a pair of spots not usable individually for reading purposes. As it shall be better explained hereinafter, such a pair of laser spots can however be used for aiming the code.

Of course, decreasing the number of faces—the diameter being equal—it is possible to increase the angular amplitude of the scan, thus reaching a particular width of the scan line at a smaller distance, that is, moving forward the motor towards the output window for further reducing the depth of the laser module 1. Of course, when decreasing the number of faces of the polygonal mirror 9, it is necessary to increase the revolving speed of motor 10 for obtaining an equal number of scans per time unit.

Figure 3A:
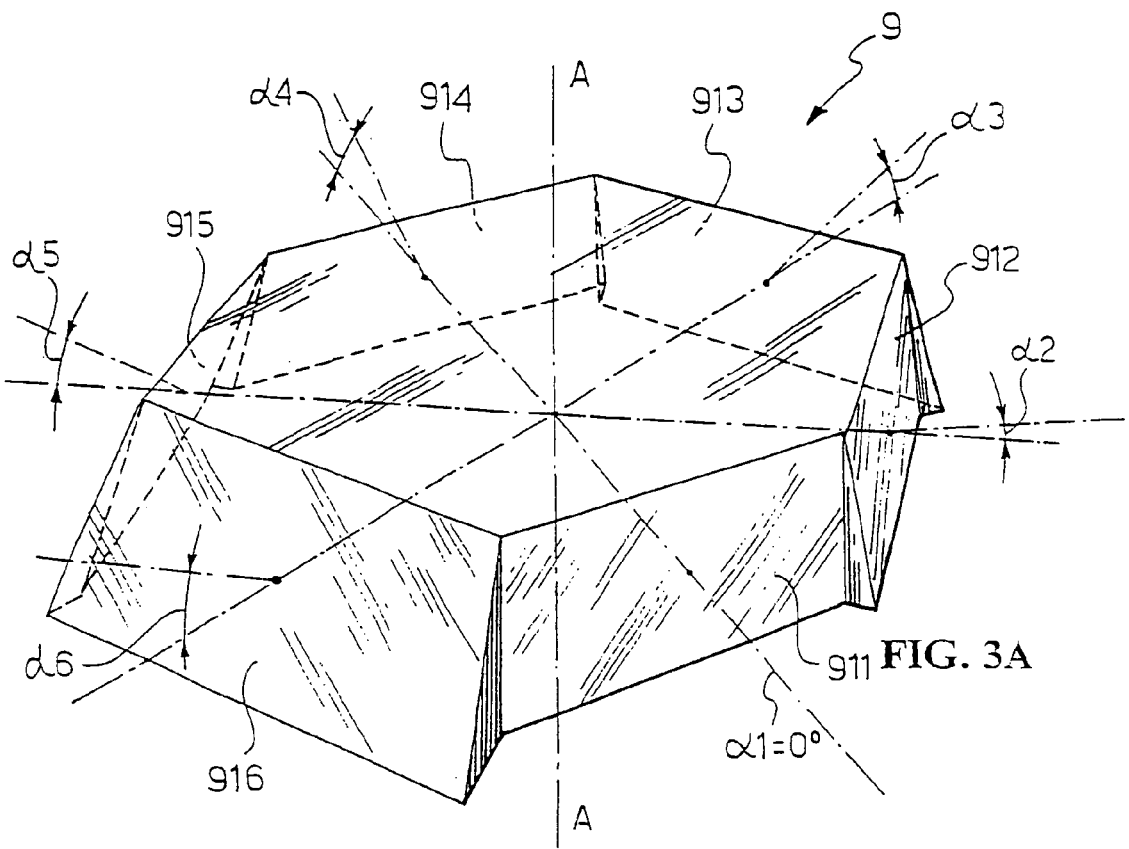
FIGS. 3A and 3B show an embodiment of an optically reflecting member useful for reading "stacked" codes.
Figure 3B:
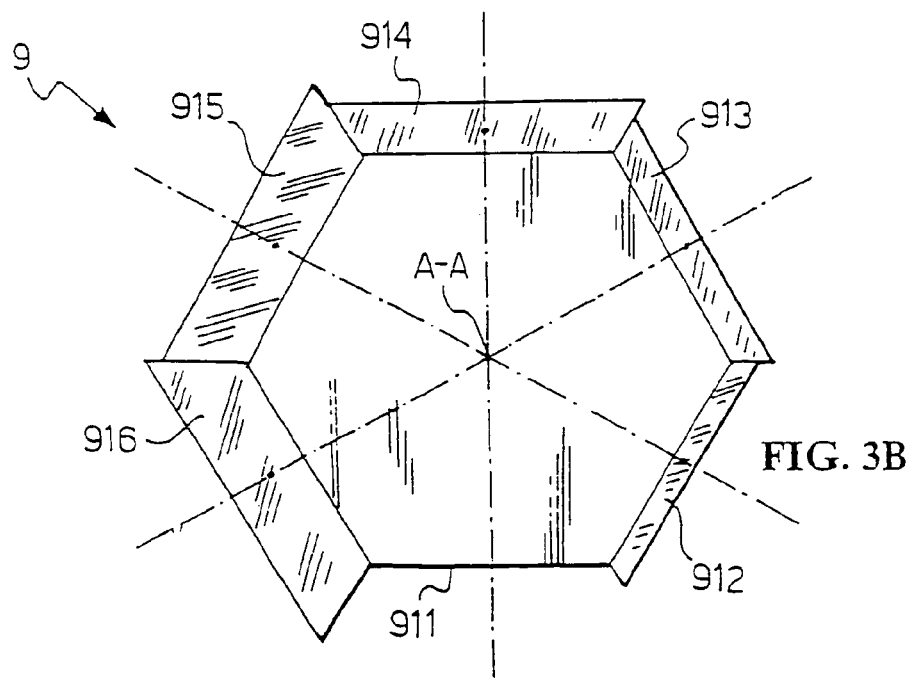

Should in a specific application stacked optical codes be read, that is, consisting of more stacked linear codes, it is convenient to produce a series of superimposed parallel scan lines, that is, which cover an area (raster). This can be obtained by sloping the single faces of the polygonal-base body (optically reflecting member 9) at different angles with respect to the axis. FIGS. 3A and 3B respectively show a perspective and a plan view of an optically reflecting member 9 with hexagonal base, whose first side face 911 is not sloping ($\alpha 1=0$) and whose other side faces 912-916 are sloping at a respective angle, increasing from $\alpha 2$ to $\alpha 6$, with respect to axis A-A. For convenience, angles $\alpha 2$-$\alpha 6$ are indicated in FIG. 3A between the normal to the surface of the respective face, and the normal to the axis. Of course, the faces may have differently ordered slopes, or they could be sloping around a median plane rather than around the top plane as shown in FIGS. 3A and 3B.

Before describing the receiving section of the laser module 1 of FIG. 1, it is worth noting that the optically reflecting member 9 may consist of a plane mirror or, more in general, of a single reflecting surface, in such cases motor 10 being driven so as to move the optically reflecting member 9 with an alternately oscillating motion along a circumference arc subtending an angle in the above ranges. For reading stacked codes, the bidimensional scan can be easily obtained by providing the possibility of a second movement of such an optically reflecting member around an axis orthogonal to the axis of the above oscillating motion.

In an optically reflecting member 9 (polygonal mirror or plane mirror) with such a small size, selected for obtaining the smallest rotating mass, the size of the or each reflecting surface is a little greater than that of the laser spot incident thereon, therefore it is not suitable to collect enough light for generating a significant return signal. A receiving section that does not exhibit components in common with the scanning illumination section, and which exhibits a front surface for collecting the light diffused by the optical code much greater than those of known laser modules, is therefore used. More precisely, the two sections are spatially distinct, that is to say, they are such that the illumination laser light and the light diffused by the code follow totally separate paths.

The components of the receiving section of the laser module 1 shown in FIG. 1 comprise a receiving window 20 obtained in the front wall 3, a glass 21, a focusing lens 22, a slit 23 and at least one photo-detecting element 24, in FIG. 1 there being shown four photodiodes 24 by way of an example. However, glass 21 and slit 23 may be omitted. All the above elements are arranged in the upper portion of the laser module 1, above the emission window 11, there being also provided a horizontal wall (not shown) for separating the receiving section from the scanning illumination section described above.

More in particular, glass 21 is arranged at the receiving window 20 and the focusing lens 22 is arranged immediately behind it, so as to face the code C to be read through the receiving window 20.

On the other hand, the photo-detecting elements 24 and the optional slit 23 are retrocessed towards the rear wall 4 of module 1 up to the position of maximum depth allowed by the space taken up by motor 10. This allows using a receiving optics with the maximum aperture (f/#, that is, ratio focal length to lens diameter) and the maximum focal length, so as to maximise the return signal and reduce its dynamics. In fact, as known, the return signal on the photo-detecting elements 24 varies with the inverse of the square of the distance from the optical code. For this reason, it is necessary that the maximum amount of light is collected at the maximum distance. It is thus necessary that the aperture (collecting front surface) of the focusing lens 22 is the maximum. On the other hand, it is preferable that the collected signal is maximum from a long distance, but from a short distance, where the return signal is much higher, the quantity of collected light must be much smaller. By way of an example, under the assumption that lens 22 concentrates all the light diffused by the code both from a long distance and from a short distance, for a maximum reading distance of 50 cm and a minimum of 5 cm, the ratio close-signal to far-signal is equal to $(50/5)^2=100:1$, such as to saturate the dynamics of a typical amplification circuit. A long-focal lens 22 perfectly focuses only when the code is at the maximum distance, while as the code is brought closer, the image is increasingly out-of-focus, so that an increasingly greater energy fraction falls out of the photodiode sensitive area. In the laser module 1, the focal length must be comprised between 6 and 10 mm, for maintaining the depth of module 10 at a maximum of 10 mm. This is advantageous since it reduces the dynamics of the signal on the amplifier to acceptable values, which in the above example is from 2:1 to 3:1.

The focusing lens 22 used in the receiving section can be spherical, diffractive, or preferably toric, or cylindrical. A toric or cylindrical lens, in fact, provides a field of view that is wide along the scan line, and narrow in the direction orthogonal thereto, thus in the application here concerned, it allows obtaining a high rejection to ambient light.

In a particularly preferred embodiment, lens 22 is a Fresnel cylindrical lens, since its flat shape makes its assembling particularly simple. Moreover, such a lens can operate up to a ratio focal length to lens diameter f/#=1, a condition in which a traditional lens is affected by considerable reflections on the surface. This solution allows assembling the lens essentially in the receiving window 20 or contacting glass 21, thus further increasing the collection efficiency, because there is no shielding of lens 22 by receiving window 20 or glass 21.

Figure 4A:
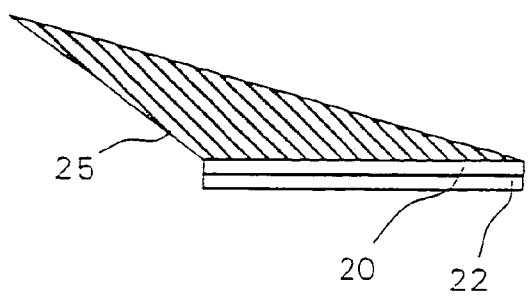
FIGS. 4A and 4B show the efficiency of different types of focusing lens.
Figure 4B:
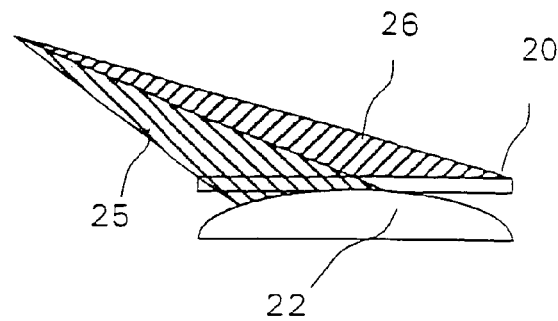

FIGS. 4A and 4B graphically show how the collected light fraction 25 in the case of a Fresnel cylindrical lens 22 (FIG. 4A) is much greater than in the case of a cylindrical or toric lens 22 (FIG. 4B), in which there is a considerable lost fraction 26.

Glass 21 of the receiving section can incorporate a filter for the purpose of reducing the noise produced by ambient light. Such a filtering glass 21 can be of the traditional type, that is, a coloured glass provided with a low-pass treatment, for example a red filter treated so as to absorb the infrared wavelengths, that is to say, higher than that of the laser radiation assumed to be red.

Lens 22 can be made of a coloured plastic material with high-pass behaviour. In this case, glass 21 can be transparent, with cost advantages, and it can serve as a protective element against the outside.

In a preferred way, moreover, there will be present a low-pass treatment, created on the transparent glass 21, or on the optically non-active face of the lens 22 itself.

In both cases, the overall cost of lens 22 and glass 21 is reduced by about one third with respect to the case of transparent lens 22 and coloured glass 21.

For minimising the possibility that light coming from an area external to the field of view lens 22, that is to say, from an area external to the scan line on the optical code, may reach the photo-detecting elements 24 of the receiving section, they are arranged—as already mentioned—as backwards as possible in the laser module 1 with respect to the receiving window 20.

The expediency of such an arrangement can be better appreciated by comparing FIG. 5A with FIG. 5B, which represents the prior art. In fact, it can be noted that in the arrangement of FIG. 5A, the rays coming from areas external to the field of view fall outside the sensitive area of the photo-detecting elements, here represented by a single photodiode 24. On the other hand, by arranging photodiode 24 immediately behind lens 22, as shown in FIG. 5B, it is also reached by sloping rays, which merely introduce noise, as they do not come from the area where the optical code C to be read is.

Since a toric or cylindrical lens forms at the focus an image which is in turn a line as wide as the lens, and very thin, photodiode 24 preferably exhibits a wide and short sensitive area, for example having an height $H_F$ less than 1.5 mm and a width $L_F$ equal to the maximum width available in the laser module 1 (between 20 and 25 mm), and of course it is arranged at the focus of lens 22. In the schematic view of FIG. 5A, the dotted line shows an essentially parallelepiped receiving chamber 27, whereas the optional elements of the receiving section, that is, the protective and/or filtering glass 21 and slit 23, are not indicated.

For obtaining such geometrical features, as an alternative to a single photodiode it is possible to use a bank or array of single photo-detecting elements (for example, small photo-diodes), as already illustrated in FIG. 1.

For selecting with greater precision the overall sensitive area interested by the light collection and/or further reducing the field of view, it is advantageous to arrange, in front of the photo-detecting elements 24, irrespectively of how they are made (single element or array), a wide and low slit 23, as already illustrated in FIG. 1.

Figure 6:
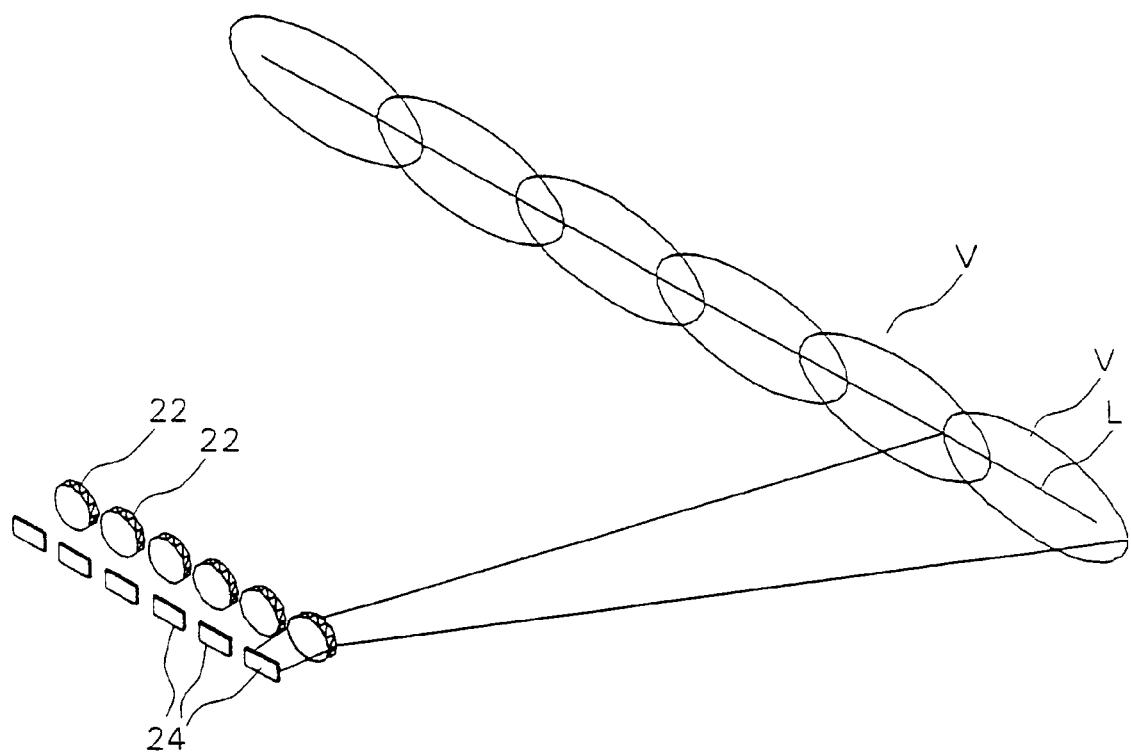
FIG. 6 schematically shows an array of photo-detecting elements, and a corresponding array of focusing lenses.

As shown in FIG. 6, in the case of an array of photo-detecting elements 24, it can be convenient to use, for the focusing, a corresponding array of focusing lenses 22, for example spherical, toric, cylindrical, optionally Fresnel lenses. In this way, the field of view V of each photo-detecting element 24 only includes a portion of the scan line L on the optical code (not shown). The field of view V of each photo-detecting element 24 is oval-shaped in FIG. 6, but of course the actual shape of the field of view V of each photo-detecting element 24 will depend on the shape of the photo-detecting element itself (square, rectangular, or circular) and on the shape of lenses 22.

Figure 7A:
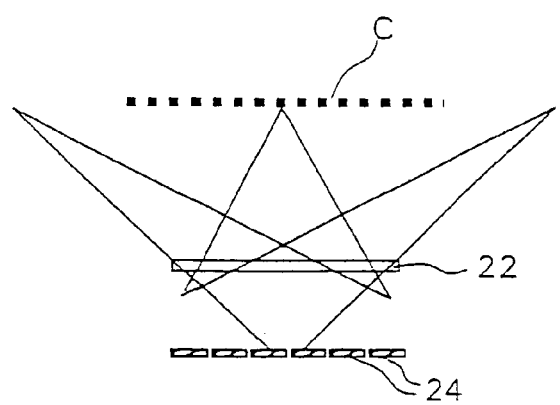
FIGS. 7A and 7B schematically show two different arrangements of photodiodes for the laser module.
Figure 7B:
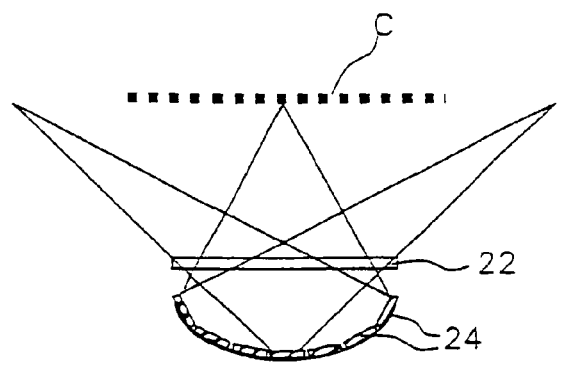

Moreover, if an array of photo-detecting elements 24 is used in reception, it is preferred to arrange them with respect to lens or lenses 22 in such a way as to allow increasing both the return signal and the angle of view of the reader. As it can be appreciated from FIG. 7A, if the photo-detecting elements 24 are arranged in a row in a plane parallel to the plane containing lens or lenses 22, the light coming from the edges of the field of view (that is to say, from the edges of the optical code C) strikes the side walls of the laser module 1 or of a receiving chamber 27 thereof, housing the components of the receiving section, and it is lost in any case. By arranging one or more photodiodes in a lateral position, for example close to the side walls of the receiving chamber 27, or even arranging the photo-detecting elements 24 along a curve, as in FIG. 7B, it is possible to recover also this portion of signal, thus increasing the collection efficiency of the system. In particular, the curve shall correspond to the optimum focus curve in the case of a single focusing lens 22.

By combining this solution with that previously described, that is, to an arrangement of photodiodes 24 as retrocessed as possible in the laser module 1, it is possible to increase the received signal without increasing the noise due to ambient light.

In this respect, a further expedient consists in using a stepping motor 10 whose motion is synchronised with the actuation of the photo-detecting elements 24 of the array. Since in any instant the position of the motor is known by being established by the control circuit, the laser spot position is accordingly known, so that it is possible to actuate only the particular photo-detecting element 24 of the array being struck by the light diffused by the code, with self-evident energy and signal/noise ratio advantages.

Figure 8:
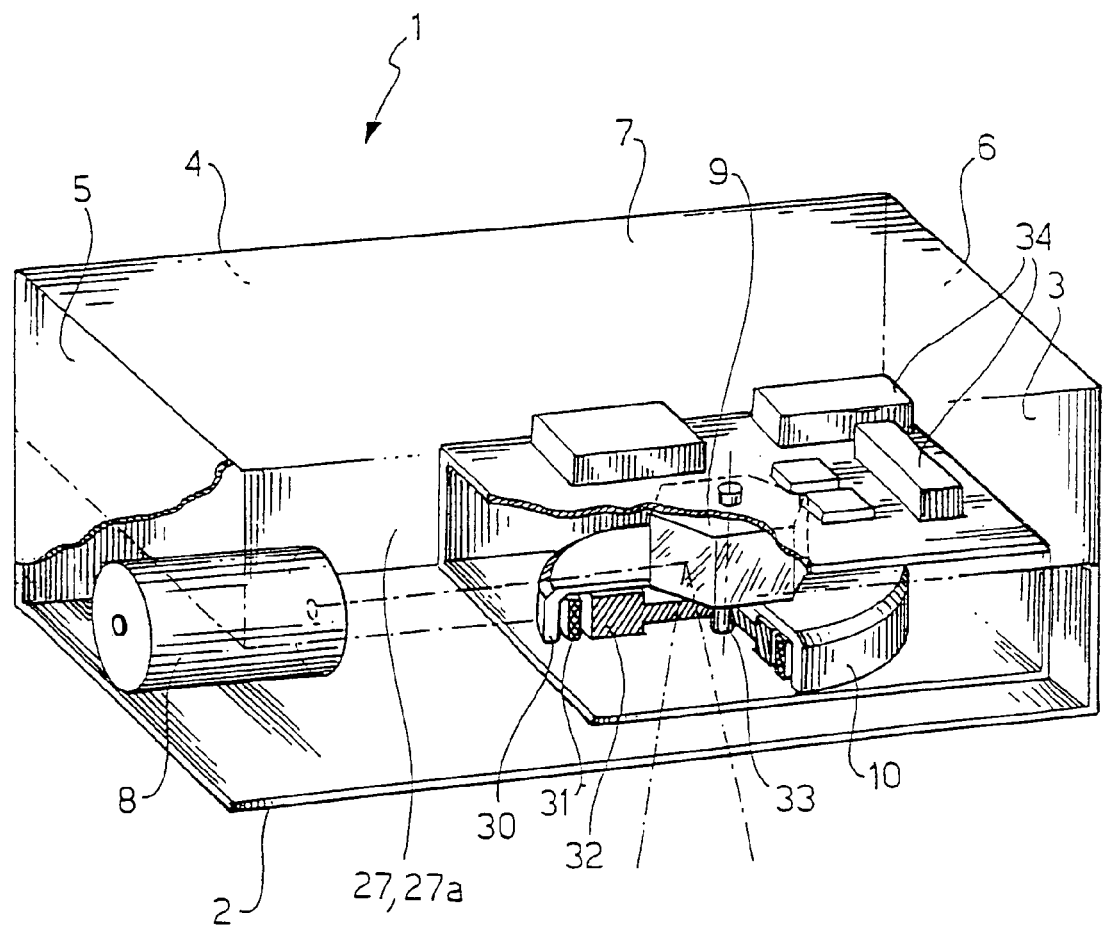
FIG. 8 shows a perspective view of a laser module according to another embodiment.

In a second embodiment, shown in FIG. 8, motor 10 has an extremely small thickness, having a height $H_M$ less than 3 mm, and such as to retain a limited plan extension, typically within a square of 20 mm×20 mm or less. In FIG. 8 it is possible to see the motor casing or stator 30, windings 31, magnet or rotor 32, the motor shaft 33 and the electronic components 34 for driving motor 10.

The small overall dimensions mentioned for motor 10 can be obtained by a great reduction of the size of a traditional stepping or brushless motor. This implies the need of reducing the size of magnets 32 and of windings 31, but it still allows obtaining a sufficient torque from the motor, provided that the mass of the polygonal mirror 9 (or other optically reflecting member) assembled on it is sufficiently small.

As regards the driving of motor 10, the above mentioned remarks apply, that is, it shall preferably occur with pulse width modulation, with continuously variable speed, and preferably with a ramp upon start up.

Moreover, in FIG. 8 it is possible to see the optically reflecting member, illustrated as a polygonal mirror 9, and the laser source 8, whereas there are not shown the components of the receiving section, schematically illustrated as a chamber 27 (dotted lines) housed above the scanning illumination section. Of course, as an alternative, the receiving section may be housed under the scanning illumination section. In any case, all the above remarks apply to these components. It shall then be understood that the arrangement of FIG. 8 allows the photo-detecting elements 24 of the receiving section to be further retrocessed towards the rear face 4 of laser module 1, thus increasing the shielding effect of the field of view of lens 22 and allowing to increase its focal length, thus improving the signal dynamics, as described above.

Also as regards the particular embodiment of the elements of the scanning illumination section other than motor 10, the above remarks apply. In particular, the polygonal mirror 9 may be replaced by a plane mirror or in any case one exhibiting a single reflecting surface, and the laser light provided by emitter 8 may be modulated at high frequency, in particular for the purpose of making a laser reader capable of measuring the distance of the optical code C.

Moreover, also in the case of FIG. 8, the positions of motor 10, of laser emitter 8 and of optically reflecting member 9 are preferably fixed through conjugate means between such elements and the casing of the laser module 1.

In place of the internal-magnet motor 10 shown in FIG. 8, it is possible to use a rotating magnetic disk motor. Such a motor is not shown, but it is structurally almost identical to the flat motor of FIG. 8, with the exception that the magnets are outside the motor and they are energised by windings in which an alternate current is circulated, which generates a moment which forces the magnetic disk in rotation. Such a solution allows assembling the optically reflecting member 9 integral with the magnetic disk, for example inserted along shaft 33, thus obtaining a very small thickness. Moreover, it is possible to keep the size of the receiving chamber 27, that is, the mutual positions of the components of the receiving section, as well as the position of laser emitter 8 and the width of the scan line at the emission window 11, as described above.

Moreover, the electronic components 34 for controlling motor 10 can be assembled on its upper plate, together with an optional shielding against electromagnetic noise caused by powering the same motor, thus improving the efficiency of the amplification circuits of the received signal. The thickness only increases by at most 1-1.5 mm.

In a further embodiment, for scanning the laser beam generated by the laser emitter 8 it is possible to use an optically reflecting member 9 with a single surface, and a motor consisting of an oscillating magnetic device, which exhibits the advantage of having a very small thickness.

Figure 9:
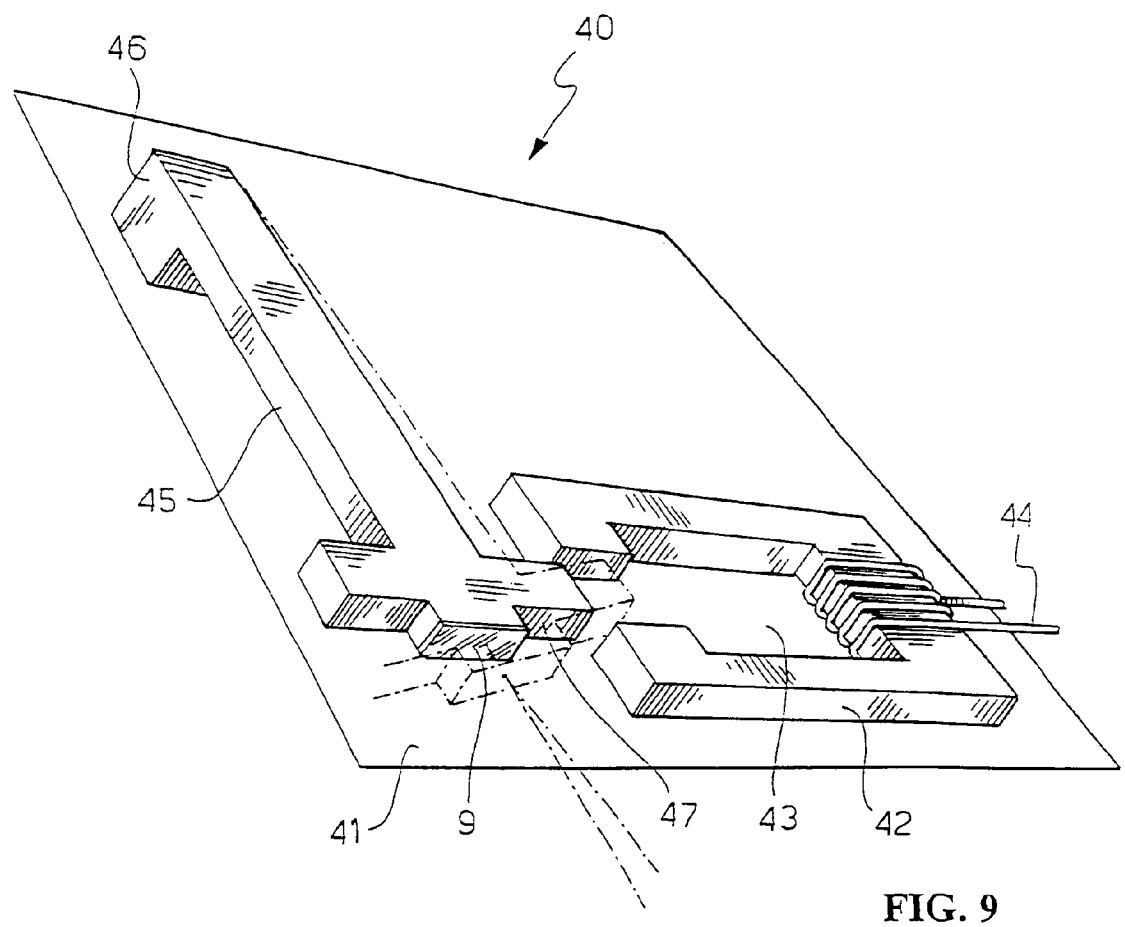
FIG. 9 schematically shows an oscillating motor for the laser module.

Such an oscillating magnetic device 40, which is based on the principle described for example in *UETP MEMS—Ca Project—Course Micro Actuators*, 1997, B. Schmidt, J. Fluitman, pages 3-7, 3-8, is schematically shown in FIG. 9.

The oscillating magnetic device 40 exhibits, on an insulating substrate 41, for example made of ceramic, a core 42 made of a magnetic material, for example of Nickel-Iron, having a "C" shape, that is, exhibiting an air gap 43. On core 42 a winding 44 made of copper or other conductive material is made, for example in the manner described in B. Rogge, J. Schulz, J. Mohr, A. Thommes, "*Magnetic Microactuators Fabricated by the LIGA—Technique for Large Displacements or Large Forces*", Proc. Actuator '1, Bremen, pages 112-115, or in Chong H. Ahn, Mark G. Allen, "*A fully integrated Surface Micromachined Magnetic Microactuator with a Multilevel Meander Magnetic Core*", Journal of MEMS, 2, pages 15-22, 1993.

Moreover, the oscillating magnetic device 40 exhibits an elongated magnetic element 45. The magnetic element 45 is essentially T-shaped, and is integral with substrate 41 at the end 46 of the T stem. The T-shaped magnetic element 45 is arranged in such way with respect to the magnetic core 42 that an end 47 of the T top-line is in the proximity of the air gap 43 of the magnetic core 42 when winding 44 is not energised (rest position), but is attracted to the air gap 43 when winding 44 is energised, as shown in FIG. 9 with dotted line. More in particular, the elongated magnetic element 45 is a resonant structure that, energised with a forcing wave having a frequency equal or close to its own frequency, vibrates at the above frequency.

At the T top-line there is applied the optically reflecting member 9, in this case a single mirror, in particular plane. Mirror 9 is thus made to oscillate for scanning the laser beam generated by the laser emitter 8.

Thanks to the possibility of making such structures with thickness down to a few mm, the oscillating magnetic device 40 shall actually exhibit a thickness equal to the mere size of the laser spot striking on mirror 9, which thus becomes the limiting element of any further reduction in the scan system thickness. Considering that such size ranges from a minimum of 0.5 to a maximum of 1.5 mm, and that substrate 41 can have a thickness of 0.5÷1.0 mm, the overall thickness of the scan means—comprising the oscillating magnetic device motor 40 and the plane mirror optically reflecting member 9—of the entire scan motor is of just 1.0÷2.5 mm.

In a further embodiment (not shown), for scanning the laser beam generated by the laser emitter 8 it is possible to use an electrostatic oscillating or rotary motor combined with an optically reflecting member 9 oscillating in the first case, rotating or oscillating in the second case.

A oscillating or rotating electrostatic motor basically consists of a capacitor, or of a series of capacitors, whose plates are alternately charged with opposed or equal polarities, so as to create an attractive/repulsive electrostatic force which cyclically tends to move them closer and apart. Through the particular embodiment of the capacitor plates, such a force causes a rotary or oscillating motion, as described and illustrated, in an exemplificative way, in the following publications: *UETP MEMS—Ca Project—Course Micro Actuators*, 1997, B. Schmidt, J. Fluitman, pages 3-1, 3-5; W. S. N. Trimmer and K. J. Gabriel, "*Design considerations for a practical electrostatic micromotor*", Sensors and Actuators, 11 (1987), pages 189-206; S. Bart, M. Mehregany, L. S. Tavrow, J. H. Lang, S. S. Senturia, "*Electric micromotors dymamics*", IEEE Transactions on Electron Devices, 39 (1992), pages 566-575 and H. Schenk, P. Dürr, H. Kück, "*A novel electrostatically driven torsional actuator*", proc. 3rd Intl. Conf. On Micro-Opto-Electro-Mechanical Sys., Mainz, Aug. 30-Sep. 1, 1999.

In still other embodiments, the means for scanning the laser beam generated by the laser emitter 8 can consist of an electro-optical device or of an acousto-optical device. Such a scan means is schematically shown in FIG. 10.

An electro-optical device 50 essentially comprises an interface between a first medium 51 and a second medium 52 (for example, two glass plates or air and a glass plate) and a circuit 53 for applying an electric field to the first and/or to the second medium. The electric field changes the refractive index of the medium it is applied to. The laser light beam generated by the laser emitter 8 and directed through the first medium 51 is thus deflected at the interface with the second medium 52 according to a controllable refraction angle. FIG. 10 does not show, for simplicity, the refractions at the interfaces between the air and the first medium 51 and between the second medium 52 and the air.

An acousto-optical device is totally similar, except in that the refractive index of the first and/or the second medium is varied through acoustic energy.

In an alternative embodiment, there are provided an array 60 of laser micro-sources and a controller 61 for driving the laser micro-sources. FIG. 11 rather schematically shows an array comprising, by way of an example, four rows 62-65 of ten laser micro-sources 66 each.

Controller 61 sequentially actuates the laser micro-sources 66 of a row 62-65 of the array 60 for scanning the optical code with a laser spot, instant by instant generated by one of the laser micro-sources 66 of the driven row 62-65.

Even though a single row of laser micro-sources is therefore sufficient (for example, row 62), there are preferably present more rows—of course, the number of four in FIG. 11 being purely exemplificative. In this way, it is thus possible to generate more scan lines at different heights in the optical code, in particular for reading stacked codes.

In a particularly advantageous way, moreover, in each row 62-65 the laser micro-sources 66 are of a different colour. Thus, for example, row 62 may generate a red laser light scan line, row 63 may generate a green laser light scan line, and so on. Controller 61 and the logics of the optical code reader in which the laser module is intended to be included may thus illuminate the optical code with the laser line of the most suitable colour for its reading, depending on the colour of the optical code itself, and of its background, for example depending on the space and bar colour of a bar code.

The laser micro-sources 66 of the array 60 shall be preferably arranged as close as possible to the rear wall 4 of the laser module 1 for the purpose of having a long scan line at the output of the emission window 11 for the reasons described above.

Figure 12:
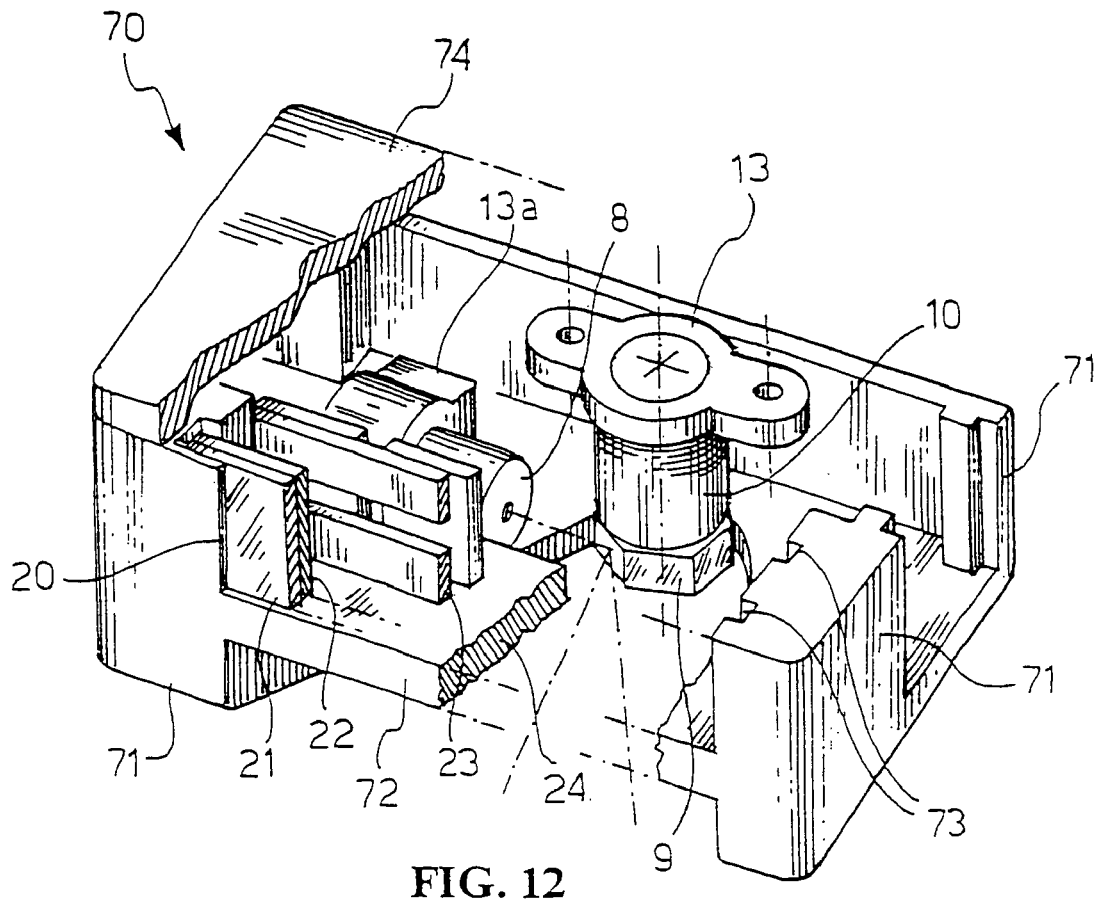
FIGS. 12 and 13 show perspective top, and respectively bottom views of a support block of the laser module components.
Figure 13:
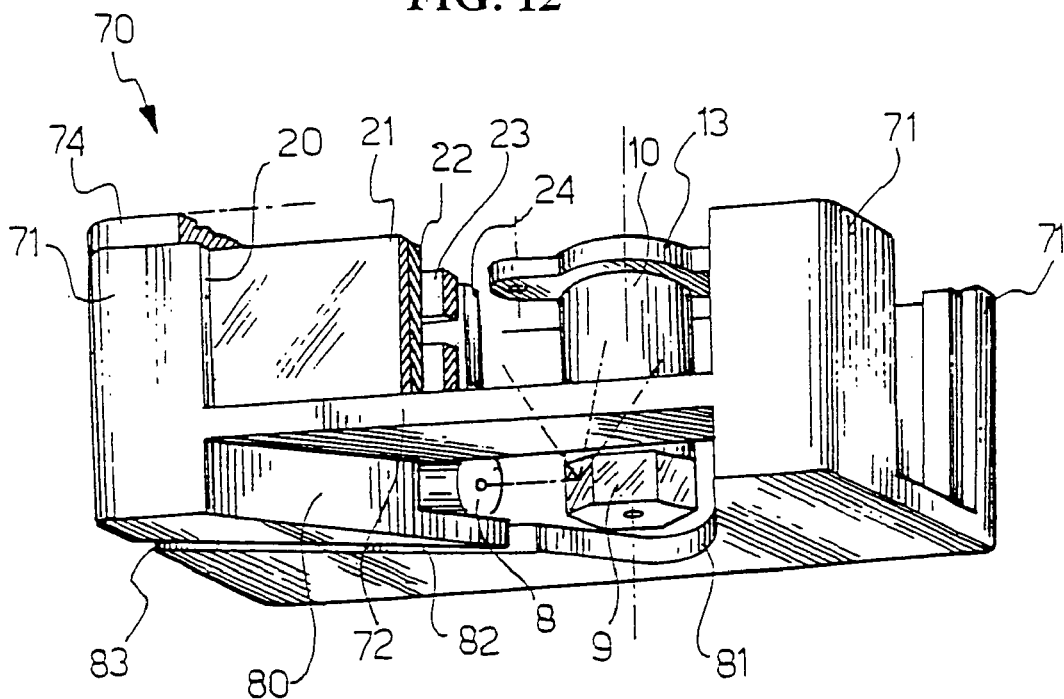

It will be now described, with reference to FIGS. 12 and 13, a block 70 particularly useful since it combines in a single moulded piece the support of both the receiving section components, and the scanning illumination section components. The support block 70 is illustrated with reference to the particular components of the embodiment of FIG. 1, but, of course, it could be used after suitable modifications also for the other embodiments described.

Firstly, the support block 70 exhibits peripheral vertical legs 71 and a horizontal partition 72. In the portion above partition 72, as it can be seen in the view of FIG. 12, the peripheral front legs 71 exhibit a series of grooves 73 wherein there are inserted the optional protective and/or filtering glass 21, the focusing lens 22, the optional slit 23 and finally, the circuits on which the photo-detecting elements 24 are welded.

In practice, the receiving section is insulated from above thanks to a thin black flexible plastic sheet (not shown) which "rests" on the upper base of the support block 70 and is kept pressed on it by the pressure of the printed circuit 74 containing the electronic components.

According to the embodiment selected for motor 10, it can be housed in the portion above partition 72 (as shown in FIGS. 12 and 13) or in the lower portion, for example in the case of motors having a smaller thickness, such as for example the magnetic disk motor or the oscillating magnetic device described above.

Figure 14:
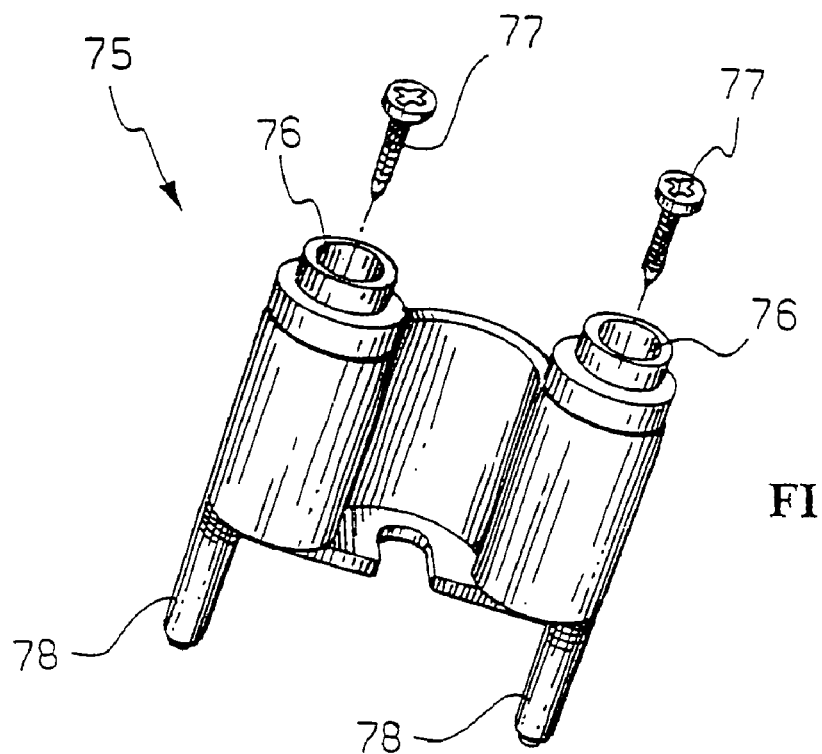
FIGS. 14 and 15 show perspective views of a support for the laser module motor, respectively with and without housed motor.
Figure 15:
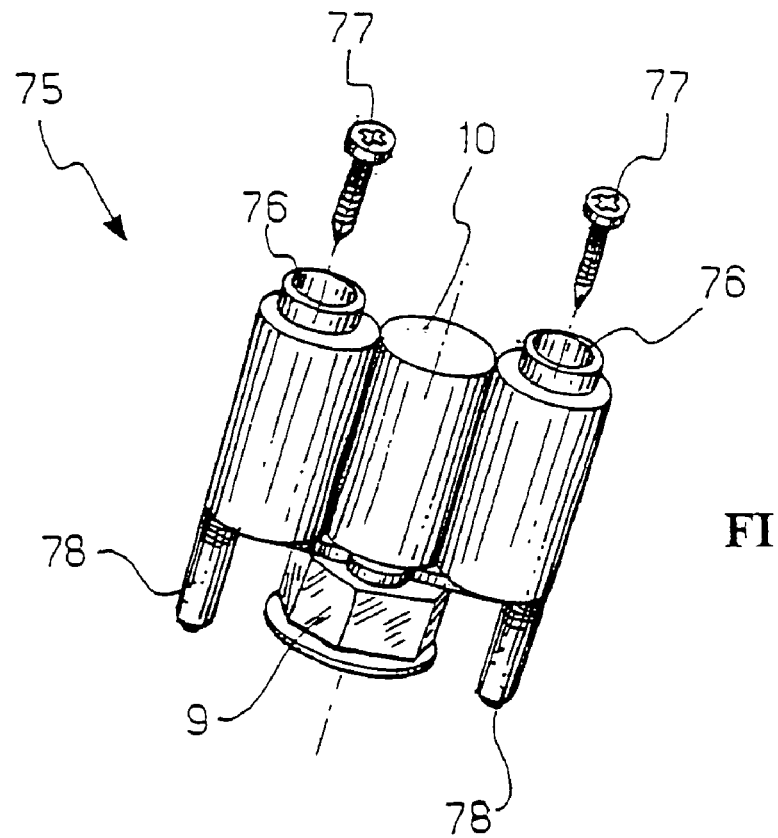

For the purpose of ensuring the placement of motor 10 and thus of the optically reflecting member 9 with respect to laser 8, both in height and in plan, it can be advantageous to provide, as an alternative to clip 13 shown in FIGS. 12 and 13, a bored cylindrical support 75 (FIGS. 14 and 15) in which the body of motor 10 may slide, said support 75 exhibiting threaded holes 76 for fastening it at one end of the upper printed circuit 74 through two screws 77 and, at the other end, being able to be introduced in two holes (not shown) properly provided in block 70, through two pins 78. In this way, the shocks are better absorbed since motor 10 is fastened in four points to the support block 70, and moreover, angular misalignments are prevented. Preferably, motor 10 is pressure fit into the support block 70, by using a carved structure so as to create a snap fit.

Turning back to FIGS. 12 and 13, in the portion below partition 72 of the support block 70 there are housed the laser emitter 8 and the optically reflecting member 9, for example the polygonal mirror shown. The latter is preferably arranged at the vertex of an essentially triangular recess defined by two vertical walls 80, 81, for the purpose of insulating the illumination laser light from the other components.

Advantageously, the lower portion of the support block 70 also exhibits a groove 82 which selects a part of the scan, carried out at a very great angle, and conveys it towards the sensitive area of a very small photodiode 83, used as a scan start sensor and for the feedback control of motor 10, as it will be better explained hereinafter. Optionally, the light collection can be facilitated by introducing in groove 82 a light guide (not shown), consisting for example of a plastic prism, such as to facilitate the coupling between the light reflected by the polygon and the sensitive area of the small photodiode 83. The end surface of such a light guide can be made diffusing (rough) for guaranteeing the coupling also in the presence of even quite considerable position errors of photodiode 83. There may be provided a second groove with a respective photodiode for detecting the scan end, as an alternative or in addition to groove 82 and photodiode 83 for detecting the scan start.

The provision of the extraction path defined by groove 82 and of the scan start photodiode 83, in se known in larger scanners, has the function of intercepting the end portion of the scan, which typically is not used since it corresponds to a very large angle, at which the laser spot falls in the middle between a face of the polygonal mirror optically reflecting member 9 and the subsequent one, or at the edge of a plane mirror. Thus, such a photodiode 83 provides a pulse for each scan, or "scan" signal, which allows synchronising the electronics on the single scan and is used, for example, by the decoder for starting to search an optical code within the scan line. Moreover, such a signal can be particularly useful for decoding systems based on reconstruction.

Of course, similar provisions can be implemented in the scanning illumination sections of the other described embodiments. For example, in the case of the array 60 of laser micro-sources, the scan start (end) signal shall correspond to the start up of the first (last) micro-source 66 of each row 62-65.

Figures 16, 18:
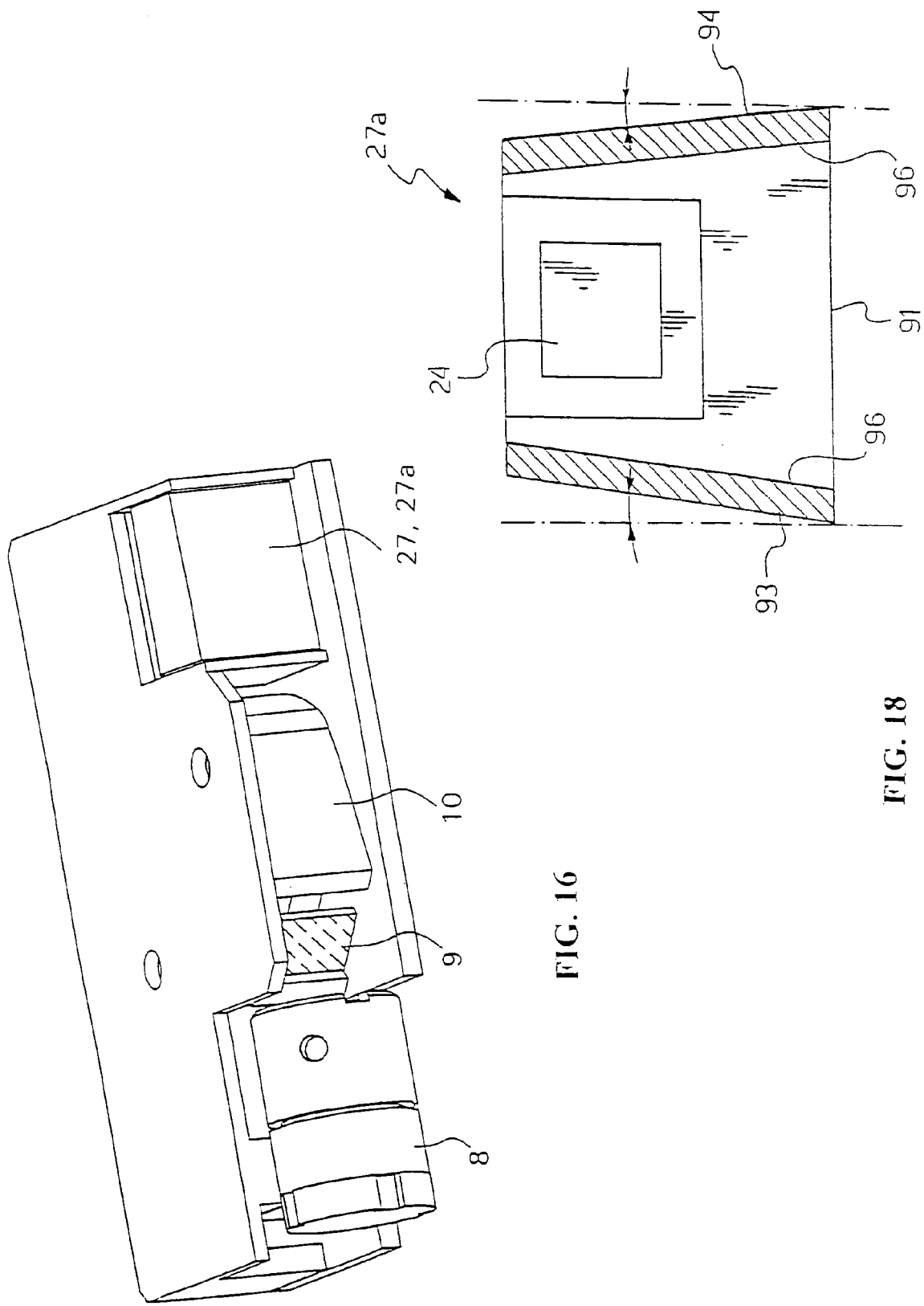

FIG. 16 schematically shows a further embodiment of a laser module 1, in which the components of the scanning illumination section and those of the receiving section are arranged in a common plane, so that the laser module 1 has an extremely reduced thickness. In FIG. 16, the scanning illumination section is illustrated as comprising a laser emitter 8, a plane mirror as the optically reflecting member 9 and a motor 10. However, such a single plane arrangement is also suitable for the other embodiments of the scanning illumination section described above. It can be noted that, in order to limit the length (that is to say, the size in the direction parallel to the scan line) of the laser module 1, the plane mirror 9 and the laser emitter 8 are arranged in the proximity of the front face of the laser module itself, mirror 9 being partly arranged in front of the motor.

In FIG. 16, the receiving section is schematically illustrated as the receiving chamber 27 or the receiving chamber 27a described hereinafter with reference to FIGS. 17-19. However, for further reducing the length of the laser module 1, the photo-detecting elements 24 may also be arranged in the proximity of the front face of the laser module, partly extending in front of motor 10 similarly to the arrangement of the plane mirror 9 of FIG. 16.

Thus, with reference to FIG. 17, the receiving chamber 27a is wedge-shaped, and it comprises a front face 90, a lower face 91 orthogonal to it, a sloping face 92 between them, and side faces 93, 94 shaped as right-angled triangles.

The focusing lens 22 (or the lens system) is arranged at the front face 90, whereas the photo-detecting elements 24 (or the single photodiode) are arranged at the lower face 91. The sloping face 92, having a maximum slope of 45° with respect to the front face 90, is provided with an internally reflecting surface 95. As shown by the dotted arrow, the rays of light diffused by code C penetrate the receiving chamber 27a from the front face 90, passing through lens 22 and arriving, through a horizontal path segment, on the internally reflecting surface 95 of the sloping face 92. At this internally reflecting surface 95, the rays of diffused light are reflected downwards, covering a second vertical segment towards the photo-detecting elements 24.

Such a wedge-shaped receiving chamber 27a allows using a lens having a longer focal length than a parallelepiped receiving chamber, depth size P being equal. A long focal length lens offers the advantages described above. From another point of view, focal length of lens 22 being equal, it is possible to make the receiving chamber 27a with a smaller depth P with respect to the receiving chamber 27, with advantages in terms of compactness of the laser module. Moreover, the horizontal arrangement of the photo-detecting elements 24 allows using a single commonly marketed photodiode, having a large area, without thus adversely affecting the thickness of the receiving chamber 27a and thus of the laser module 1. Moreover, the horizontal arrangement of the photo-detecting elements 24 prevents the need of providing a vertical printed circuit for their control and for receiving their output electrical signal, as it is necessary in the other described embodiments. On the contrary, on the same printed circuit there can also be provided the necessary components and connections for powering and controlling the scanning illumination section. Such a printed circuit may for example form the base of the laser module 1 of FIG. 16.

For recovering also the light coming from the edges of the scan line of the optical code C, increasing the efficiency of light collection without increasing the noise due to ambient light, also the side faces 93, 94 of the receiving section 27a can be provided with internally reflecting surfaces 1.

For further improving the light collection efficiency, the side faces 93, 94 of the receiving section 27a can, moreover, be slightly converging away from the front face 91, as shown in the top view of FIG. 18.

In the embodiment of FIG. 17, the receiving chamber 27*a* is hollow, its faces 90, 92 and optionally, 93, 94, 91 respectively consisting of lens 22, mirrors 95, 1 and photodiode 24.

As an alternative, as shown in FIG. 19, the receiving section 27*a* can consist of a block 97 of an optically transparent material shaped as a wedge in the manner described above, and having a mirror treatment on the sloping face 92 and optionally on the side faces 93, 94. In this way, the mutual orientation of the various faces is more easily controllable.

Although it has been described with reference to the arrangement in the same plane of the scanning illumination section components (FIG. 16), it is manifest that the above advantages of such a wedge-shaped receiving chamber 27*a* make its use advantageous also above or below the scanning illumination section, in this case the wedge-shaped receiving chamber 27*a* being preferably assembled upside down with respect to the orientation of FIGS. 17-19, that is with the lower face 91 arranged on the top, at the parting plane from the scanning illumination section.

In the practical use of the laser module 1 for reading optical codes, it can be useful to allow the operator to aim at the optical code before starting the reading. This can be obtained by assembling the scanning optically reflecting member 9 in a predetermined position with respect to the shaft (rotation axis) of motor 10, so that, upon start up, by suitably driving motor 10, such an optically reflecting member 9 arranges in a predetermined position with respect to the incident laser beam.

All the rotary motors described above are characterised by the presence of a certain number of magnetic dipoles (at least one) on the rotating portion (rotor), and of a certain number of windings on the stator. It can be imagined to reduce the number of magnetic dipoles on the rotor to only one. Then, if upon start up only one of the stator windings is powered, with a direct current, the rotor arranges in a univocal position. Thus, it is possible to assemble the optically reflecting member in a predetermined position with respect to the rotor. Since the stator windings are also arranged in a predetermined position with respect to the outer casing and to the pins, it is also possible to assemble the motor on the printed circuit so that the windings are always in a predetermined position with respect to the printed circuit, and thus to the arrival direction of the laser beam. In more detail, the assembling operation can follow the sequence below.

The motor is assembled on the printed circuit with the pins oriented so that the windings are in a preset position with respect to the incident laser beam. Then, a winding is powered with direct current so that the rotor dipole aligns with the polarity of the powered winding. With the rotor in this angular position, the optically reflecting member is assembled with such an orientation as to produce a fixed spot at the centre of the scan line, or two spots at the edges of the scan line, in the case of a polygonal mirror mounted with an edge at the incident laser beam.

Once thus fastened, the optically reflecting member places itself in the same position every time the same winding is fed, thus allowing an effective aiming. For allowing such a stand-by of the laser source with respect to the actuation of the motor for scanning the laser beam, there can be provided independent actuation buttons, a single dual-position switch, or a preset delay. Moreover, it can be advantageous, for safety reasons, to provide for the automatic switching off of the laser in case the motor is not started within a predetermined time from the laser start up.

A similar provision can be easily embodied in the case of the other described scanning illumination sections. Thus, in the case of the magnetic oscillating device 40, the stand-by position can be established by the absence of powering in the winding; in the case of the electro-optical or acousto-optical devices 50, by the absence of driving of the same devices; in the case of the micro-sources array 60, by the start up of the central source or of the two end sources of a row.

Finally, in all the embodiments described above, in case an array of photo-detecting elements 24 of the C-MOS type is used, it is possible to integrate all the sensor control logics, the digitising logics and the decoding logics on a same chip. In this way, the size and costs of the system can be further reduced.

For the purpose of reducing the number of components present, moreover, it will be also possible to provide a dedicated integrated circuit capable of totally digitally processing the signal produced by the photo-detecting elements 24. Such a circuit shall contain an analogue-to-digital converter for providing the sampled analogue signal to a digital processing circuitry. In this way, all the analogue components required for digitising are avoided, being replaced by a single dedicated digital chip.

For economical reasons and for simplicity of assembling, the same integrated circuit can contain all the circuits required for the motor control.

A further advantageous provision consists in producing, in an optical code reader in which the module laser 1 is embedded, a circuit capable of providing both the digitised output, needed for compatibility reasons with the products already existing on the market, and the decoded output. In this way, readers of very small size and low cost can be implemented.

The invention claimed is:

1. A receiving section for an optical code scanner, said receiving section comprising at least one receiving chamber, said receiving chamber comprising:
   a light input front face,
   a detection face, orthogonal to said front face, and at which at least one photo-detecting element is arrangeable,
   an internally reflecting sloping face, located between said front face and said detection face, and
   side faces each abutting, at three sides thereof, on said front face, said detection face, and said sloping face, thereby creating said receiving chamber for the scanner.

2. The receiving section according to claim 1, wherein the receiving section comprises at least one focusing lens arranged at said front face of the receiving chamber.

3. The receiving section according to claim 1, wherein the slope angle between the sloping face and the front face is less than 45 degrees.

4. The receiving section according to claim 1, wherein said side faces are internally reflecting.

5. The receiving section according to claim 1, wherein the side faces of the receiving chamber are slightly converging away from the front face.

6. The receiving section according to claim 1, wherein said at least one receiving chamber comprises a solid, optically transparent material.

7. The receiving section according to claim 1, wherein the side faces are connected with said front face, said detection face, and said sloping face in edge-by-edge manner thereby creating said receiving chamber for the scanner.

8. A scanner for reading optical codes comprising:
   an illumination section configured to illuminate an optical code to be read, and
   a receiving section configured to collect and detect at least a portion of the light diffused by the code, said receiving section comprising at least one receiving chamber, said chamber comprising:
   a light input front face;

a detection face, orthogonal to said front face, at which detection face at least one photo-detecting element is located;

an internally reflecting sloping face, located between said front face and said detection face; and side faces each abutting, at three sides thereof, on said front face, said detection face, and said sloping face, thereby creating said receiving chamber of the scanner.

9. A scanner according to claim 8, wherein said illumination section and said receiving section are arranged in a common plane.

10. A scanner according to claim 9, wherein said receiving section is arranged beside said illumination section.

11. A scanner according to claim 8, wherein said at least one receiving chamber comprises a solid, optically transparent material.

12. A laser scanner according to claim 8, wherein the illumination section and the receiving section are arranged in stacked planes.

13. A scanner according to claim 8, wherein the side faces are connected with said front face, said detection face, and said sloping face in edge-by-edge manner thereby creating said receiving chamber of the scanner.

14. A scanner according to claim 8, further comprising a support member configured to support the illumination section and the receiving section.

15. A scanner according to claim 14, wherein the support member is configured to support the illumination section and the receiving section in a common plane.

16. A scanner for reading optical codes comprising:

an illumination section configured to illuminate an optical code to be read, a receiving section configured to collect and detect at least a portion of the light diffused by the code, said receiving section comprising at least one receiving chamber, said chamber comprising:

a light input front face;

a detection face, orthogonal to said front face, at which detection face at least one photo-detecting element is located;

an internally reflecting face located between said front face and said detection face; and side faces each abutting, at three sides thereof, on said front face, said detection face, and said internally reflecting face, thereby creating said receiving chamber of the scanner; and wherein the illumination section and the receiving section are arranged in stacked planes.

17. A scanner according to claim 16, wherein the side faces are connected with said front face, said detection face, and said internally reflecting face in edge-by-edge manner thereby creating said receiving chamber of the scanner.

18. A scanner according to claim 16, further comprising a support member configured to support the illumination section and the receiving section.

* * * * *